US008861218B2

(12) United States Patent
Smith et al.

(10) Patent No.: US 8,861,218 B2
(45) Date of Patent: Oct. 14, 2014

(54) DEVICE CONTAINING PLURALITY OF SMALLER MEMS DEVICES IN PLACE OF A LARGER MEMS DEVICE

(75) Inventors: Charles Gordon Smith, Cambridge (GB); Richard L. Knipe, McKinney, TX (US); Vikram Joshi, Mountain View, CA (US); Roberto Gaddi, Hertogenbosch (NL); Anartz Unamuno, Roermond (NL); Robertus Petrus Van Kampen, Hertogenbosch (NL)

(73) Assignee: Cavendish Kinetics Inc., San Jose, CA (US)

( * ) Notice: Subject to any disclaimer, the term of this patent is extended or adjusted under 35 U.S.C. 154(b) by 913 days.

(21) Appl. No.: 12/614,929

(22) Filed: Nov. 9, 2009

(65) Prior Publication Data

US 2010/0116632 A1 May 13, 2010

Related U.S. Application Data

(60) Provisional application No. 61/112,521, filed on Nov. 7, 2008.

(51) Int. Cl.
*H05K 1/18* (2006.01)
*H01G 5/40* (2006.01)
*G01P 15/135* (2006.01)
*H01G 5/18* (2006.01)
*B81B 7/04* (2006.01)
*G01P 15/125* (2006.01)
*G01P 15/08* (2006.01)

(52) U.S. Cl.
CPC ........... *B81B 7/04* (2013.01); *B81B 2201/0221* (2013.01); *B81B 2201/0235* (2013.01); *H01G 5/40* (2013.01); *G01P 15/135* (2013.01); *B81B 2207/053* (2013.01); *H01G 5/18* (2013.01); *G01P 15/125* (2013.01); *G01P 15/0802* (2013.01)
USPC ............ 361/763; 361/760; 361/782; 361/784

(58) Field of Classification Search
USPC .................. 257/415–417, 528; 200/180–182; 361/782–784, 760–766
See application file for complete search history.

(56) References Cited

U.S. PATENT DOCUMENTS 5,472,539 A * 12/1995 Saia et al. ..................... 156/155
5,619,061 A * 4/1997 Goldsmith et al. ........... 257/528

(Continued)

FOREIGN PATENT DOCUMENTS

CN 1865124 A 11/2006
CN 101033057 A 9/2007

(Continued)

OTHER PUBLICATIONS

Kim et al., "Inertial sensing paradigm using an accelerometer array: XL-array", Proceedings of the International Society for Optical Engineering (SPIE), SPIE, USA, vol. 3892, Oct. 1, 1999, pp. 204-211.

(Continued)

*Primary Examiner* — Tuan T Dinh
(74) *Attorney, Agent, or Firm* — Patterson & Sheridan, LLP

(57) ABSTRACT

Embodiments disclosed herein generally include using a large number of small MEMS devices to replace the function of an individual larger MEMS device or digital variable capacitor. The large number of smaller MEMS devices perform the same function as the larger device, but because of the smaller size, they can be encapsulated in a cavity using complementary metal oxide semiconductor (CMOS) compatible processes. Signal averaging over a large number of the smaller devices allows the accuracy of the array of smaller devices to be equivalent to the larger device. The process is exemplified by considering the use of a MEMS based accelerometer switch array with an integrated analog to digital conversion of the inertial response. The process is also exemplified by considering the use of a MEMS based device structure where the MEMS devices operate in parallel as a digital variable capacitor.

12 Claims, 17 Drawing Sheets

(56) References Cited

U.S. PATENT DOCUMENTS

| | | | |
|---|---|---|---|
| 6,000,287 A | 12/1999 | Menzel | |
| 6,625,047 B2 * | 9/2003 | Coleman, Jr. | 365/51 |
| 6,635,506 B2 * | 10/2003 | Volant et al. | 438/52 |
| 6,958,123 B2 | 10/2005 | Reid et al. | |
| 7,275,424 B2 | 10/2007 | Felton et al. | |
| 7,357,017 B2 | 4/2008 | Felton et al. | |
| 7,541,214 B2 | 6/2009 | Wan | |
| 2005/0017313 A1 * | 1/2005 | Wan | 257/415 |
| 2005/0168306 A1 * | 8/2005 | Cohn et al. | 335/78 |
| 2007/0004096 A1 * | 1/2007 | Heuvelman | 438/127 |
| 2007/0264741 A1 * | 11/2007 | Patel et al. | 438/49 |
| 2008/0196502 A1 | 8/2008 | Fukuda et al. | |
| 2010/0038731 A1 * | 2/2010 | Van Kampen et al. | 257/415 |
| 2010/0237738 A1 * | 9/2010 | Smith et al. | 310/309 |

FOREIGN PATENT DOCUMENTS

| | | |
|---|---|---|
| JP | 2003-264123 A | 9/2003 |
| JP | 2006-099087 A | 4/2006 |
| JP | 2007-531059 A | 11/2007 |
| JP | 2008-008820 A | 1/2008 |
| JP | 2008-091167 A | 4/2008 |
| JP | 2008-515150 A | 5/2008 |
| JP | 2008-532068 A | 8/2008 |
| JP | 2008-532069 A | 8/2008 |

OTHER PUBLICATIONS

Invitation to pay additional fees for PCT/US2009/063616 dated Nov. 18, 2010.

International search report and written opinion for PCT/US2009/063616 dated Dec. 27, 2010.

Office action dated Nov. 19, 2013 for Japanese Patent Appplication No. 2011-535705 (CK059JP).

Office action dated Jan. 16, 2014 for European Patent Application No. 09749300.1-1552.

Office action dated Nov. 26, 2013 for Chinese Patent Application No. 200980147111.2.

Office action for Chinese Patent Application No. 200980147111.2 dated Jul. 2, 2013.

* cited by examiner

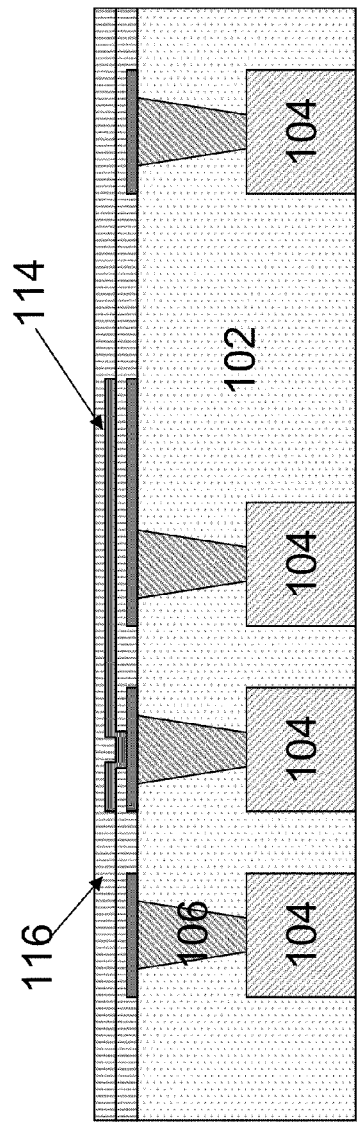
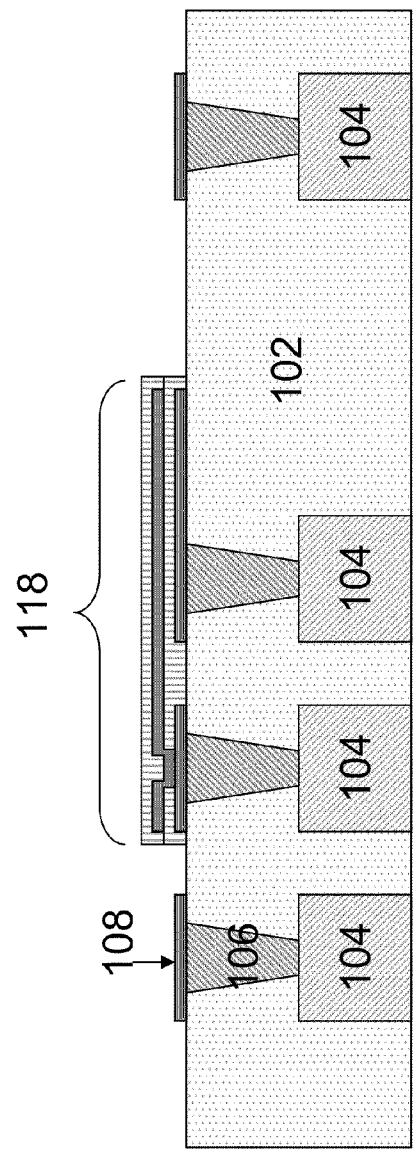

Designed pull off forces

0    Fs-Ft (NanoNewtons)

DEVICE CONTAINING PLURALITY OF SMALLER MEMS DEVICES IN PLACE OF A LARGER MEMS DEVICE

CROSS-REFERENCE TO RELATED APPLICATIONS

This application claims benefit of U.S. Provisional Patent Application Ser. No. 61/112,521, filed Nov. 7, 2008, which is herein incorporated by reference.

BACKGROUND OF THE INVENTION

1. Field of the Invention

Embodiments of the present invention generally relate to a device and a method of using the device where a plurality of smaller micro-electromechanical system (MEMS) devices replace a single, larger MEMS device.

2. Description of the Related Art

MEMS devices are routinely produced using semiconductor processing. This allows accelerometers, pressure sensors, low resistance current switches or RF switches, variable capacitance devices, resonators and other devices to be manufactured cheaply. For many of these devices to work with the desired physical properties they usually cover an area of several hundred microns square. It is then very difficult to seal such a device in a cavity using the typical interlayer dielectrics found in the back end or the metallization found in the back end because these are of the order of 1 micron thick. In many radio frequency applications, it is desirable to have a variable capacitor that can be used, for example, for tuning a resonant LRC circuit in an antenna module. The variable capacitor can be used for switching between carrier frequencies in a mobile phone or other apparatus that may be used at a number of different frequencies.

A low pressure cavity is usually required for the operation of these devices, which leads to a pressure on the roof of the cavity. With the MEMS devices being over 100 microns wide, the cavity will collapse under the external pressure. To solve this problem MEMS devices are separately packaged which can double the price of a device. In some applications it would be advantageous to have a MEMS device on the same chip as a micro controller or other logic device, but that is not possible because it must be separately packaged.

MEMS based accelerometers have been built using a variety of micro-machining techniques for many years. Most of these MEMS based accelerometers rely upon precise micromachining of a single proof mass suspended by beams to set the sensitivity and signal range of the sensor. The typical sensing scheme is capacitance based, but other sensing strategies have been used. The size of the proof mass, is normally of the order of 100 microns in at least two dimensions, and may be a few microns in size in the third spatial dimension. Once the suspension system is added, careful packaging strategies ranging from reverse wafer bonding to full hermetic packages are required. These complex packaging strategies add to the cost of the sensor and limit the sensors ability to be fully integrated in a standard back and of the line (BEOL) or standard packaging flow.

Therefore, there is a need for a device integrated into the chip and a method for its manufacture.

SUMMARY OF THE INVENTION

Embodiments disclosed herein generally include using a large number of small MEMS devices to replace the function of an individual larger MEMS device. The large number of smaller MEMS devices perform the same function as the larger device, but because of the smaller size, they can be encapsulated in a cavity using complementary metal oxide semiconductor (CMOS) compatible processes. Signal averaging over a large number of the smaller devices allows the accuracy of the array of smaller devices to be equivalent to the larger device. The process is first exemplified by considering the use of a MEMS based accelerometer switch array with an integrated analog to digital conversion of the inertial response. In the second example we will discuss breaking up a large MEMS based variable capacitor, in which the capacitance is controlled by the gap between a MEMS switch and a landing electrode, into an array of smaller MEMS variable capacitors which are connected in parallel and are either stuck up away from the landing electrode, or stuck down to a thin oxide over the landing electrode. Thus the array acts as a digital variable capacitor.

In one embodiment, a MEMS device may be used as a variable capacitor such that the capacitor is broken up into an array of small MEMS capacitors. These smaller capacitors may be housed in a cavity that can be fabricated in a CMOS compatible process in the back end metallization of a semiconductor integrated device. Each smaller capacitor has two well defined capacitance states: either fully pulled into a landing electrode with a thin insulator on top or fully free standing with the signal line away from the cantilever. By breaking the capacitor up into a large number of smaller capacitors that act in parallel, a desired capacitance can be created as long as the individual capacitance of each variable capacitor is small enough to give the resolution in capacitance that is required.

In another embodiment, a device structure is disclosed. The device structure may include a substrate and a plurality of layers formed over the substrate. A first layer of the plurality of layers may bound one or more cavities formed within the structure between the substrate and the plurality of layers. The structure may also include a plurality of devices disposed over the substrate and within the one or more cavities.

In another embodiment, a method of using a device structure is disclosed. The device structure may include one or more cavities and a plurality of devices within the one or more cavities. Each device may include a corresponding landing electrode. The method may include applying a first electrical bias to the plurality of landing electrodes to move the plurality of devices from a first position spaced from a plurality of landing electrodes into a second position in contact with the plurality of landing electrodes. The method may also include moving one or more of the plurality of devices and detecting a number of devices that remain in contact with the plurality of landing electrodes following the acceleration. The method may also include applying a second electrical bias to the plurality of landing electrodes to move the plurality of devices into the second positions.

In another embodiment, a method of using a device structure is disclosed. The device structure may include one or more cavities and a plurality of devices within the one or more cavities. Each device may include a corresponding landing electrode disposed within the cavity. The method may include moving all devices to a first position spaced from the landing electrodes and moving one or more of the plurality of devices. The method may also include detecting a number of devices that have moved to a second position in contact with the plurality of landing electrodes following the acceleration and moving all devices to the first position.

In another embodiment, a method of operating a digital variable capacitor is disclosed. The digital variable capacitor has a plurality of micro electromechanical devices formed within a cavity. The method includes moving a plurality of cantilevers from a first position spaced a first distance from an RF electrode to a second position spaced a second distance from the RF electrode. The first distance is greater than the second distance. The method also includes moving the plurality of cantilevers to the first position. The method additionally includes moving the plurality of cantilevers to a third spaced a third distance from the RF electrode, the third distance is greater than the first distance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1I show of an encapsulation method in accordance with an embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
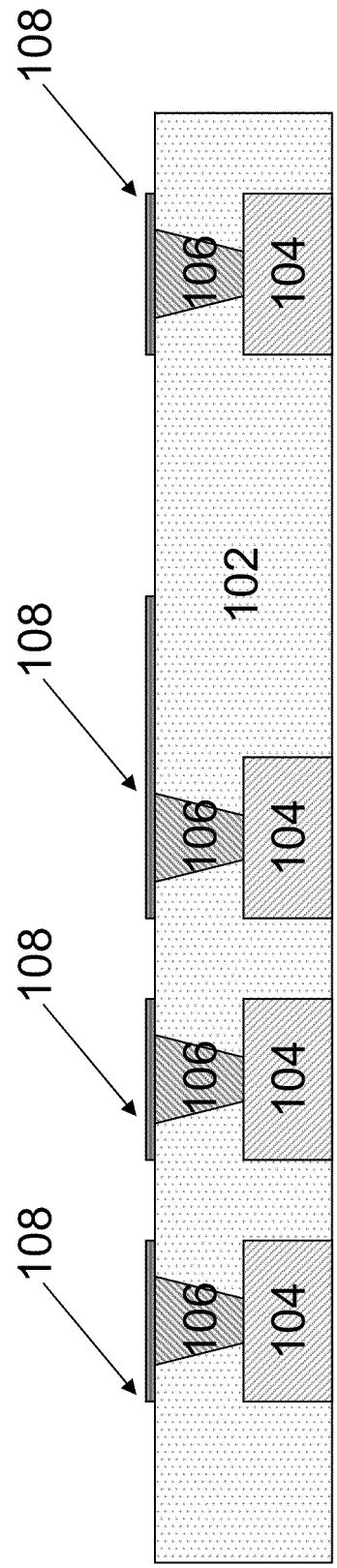

Embodiments discussed herein generally include using a large number of small MEMS devices to replace the function of an individual larger MEMS device or a digital variable capacitor. Solutions discussed herein include breaking up a single MEMS device or a variable capacitor into an array of smaller MEMS devices that perform the same function as the single larger MEMS device variable capacitor. Each individual MEMS device in the array may only be a few microns across and so can be housed in a cavity that fits within the back end metallization. The roof of the cavity can be 1 micron thick interlayer dielectric for example, and because it is only a few microns wide, the atmospheric pressure outside is not large enough to cause any significant deformation of the cavity roof, even for an evacuated cavity.

To illustrate why an array of small MEMS devices acting to measure some physical phenomena has an advantage over a single large MEMS device, some of the embodiments discussed herein show the application of a MEMS accelerometer, but the present invention of using a plurality of smaller MEMS devices to replace a larger MEMS devices is not limited to this application.

The present invention could be used to make a fast, low voltage current switch consisting of many small cantilevers in parallel, or an RF switch, or a variable capacitor could also be broken up into an array of smaller switches working in parallel. The advantage being that by replacing the larger MEMS device with a large number of smaller devices, each one can be reduced to a size that allows them to be encapsulated on chip using a CMOS compatible process of deposition, lithography and etching. By scaling down all the devices the switching voltages can be reduced and the speed of switching can be increased.

The smaller MEMS devices can also be housed in their own cavity defined in the interlayer dielectric of a standard CMOS process. By using temperatures less than 400 degrees Celsius to fabricate the MEMS devices and cavities, they can be easily integrated into the metallization layers of a standard CMOS process allowing MEMS devices to be incorporated on a CMOS chip. This reduces the cost of production because a separate MEMS chip with more expensive MEMS packaging is no longer required.

By fabricating a micro-cavity around the individual MEMS devices in the CMOS fabrication facility it is possible to remove the sacrificial layer around the MEMS device and seal it in the same processing tool, which means the device environment is controlled at a low pressure and avoiding exposure to oxygen or water vapor for example. This allows transition metals to be used in the cavity without oxidizing so that they have low resistance contact surfaces.

An array or ensemble of MEMS switches where each switch or multiple switches are in their own internal cavity within the CMOS is disclosed. By using an array of smaller switches, an integration scheme can be used where individual switches or small groups of switches can be embedded into small cavities in between the metal layers typically found in semiconductor processing.

Sensing can be achieved either through measuring the change of capacitance of the array of cantilevers as they move under acceleration forces, in the same way as the capacitance of a single larger device is measured or in a number of other ways. However the large number of switches offers a new measurement technique consisting of the simple act of checking for electrical continuity of each switch during a finite time sample interval. Inertial loads such as acceleration cause a percentage of switches to change from closed to open during the sample period. When a single switch changes state, this forms a digital signal event. The raw percentage of the collection of switches which change state forms an integer number that represents the magnitude of the analog inertial input. The sensitivity of the collection of switches depends then upon the switch design, adhesion distribution of the contact electrode, and the total number of switches. The sensitivity of the switches to an acceleration event can be increased by applying a DC pull off voltage which tries to overcome the adhesion of the other end of a rocker arm. Then a small extra force causes the cantilevers to move to the point where they are pulled off the contact electrode. In this way smaller acceleration values can be measured. The device can also be operated in the other direction where the cantilever is free standing and an acceleration will cause it to switch on. A DC voltage can then be used on a close by electrode to apply a DC electrostatic force which tries to pull the cantilever into contact then a small extra acceleration causes the cantilever to switch on.

With reference to FIGS. 1A-1I, a method of forming a device within a micro-cavity will now be described. In order to describe how to connect an element within the micro-cavity to a circuit outside the micro-cavity, a fixed end MEMS cantilever fabrication is shown. As will be appreciated, any other suitable device could be encapsulated in the micro-cavity including accelerometers, variable capacitors or RF switches and three way switches. As will also be appreciated, the embodiment described hereafter can be fabricated in any BEOL that employs chemical mechanical planarization (CMP) of inter-metal dielectric (IMD) films.

FIG. 1A shows the result of the first step of a method in accordance with the present invention. The first step consists of using known CMOS process steps to fabricate a wafer up to a predetermined metal level within the aluminum CMOS BEOL. The CMOS BEOL comprises an inter-metal dielectric layer 102 having metal channels 104 therein. In one embodiment, the dielectric layer 102 may comprise silicon dioxide. The vias 106 are fabricated using known methods such as conventional lithography and etch processes. The vias 106 may comprise a liner layer and a metal fill. In one embodiment, the liner may comprise titanium. In another embodiment, the liner may comprise titanium nitride. In one embodiment, the fill material may comprise tungsten. In another embodiment, the fill material may comprise copper. In another embodiment, the fill material may comprise aluminum. The vias 106 may be capped with a titanium and/or titanium nitride layer. The titanium and/or titanium nitride layer may be patterned using conventional lithography and etch processes to form a plurality of electrodes 108, one of which will be the lower electrode of the MEMS cantilever device.

Figure 1B:
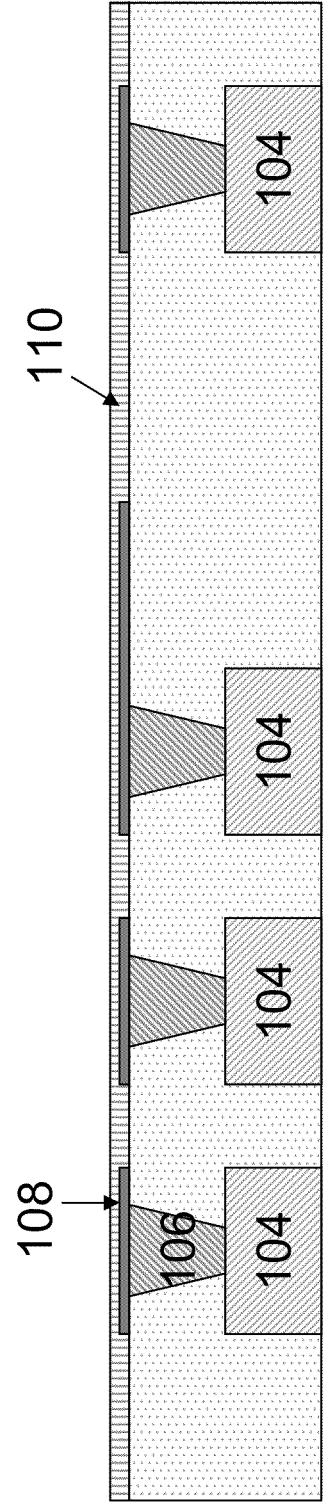

FIG. 1B shows the result of the second step of the method. This step comprises coating the lower half of the first sacrificial layer 110 on the wafer surface over the patterned electrodes 108. As this layer is the first sacrificial layer 110, its thickness will be chosen to permit the operation of the device within the resulting cavity. In one embodiment, the first sacrificial layer 110 may have a thickness between about 30 nm and about 500 nm. The first sacrificial layer 110 may comprise a high temperature spin-on organic film. However, other films such as silicon nitride, silicon dioxide, amorphous silicon and amorphous carbon, can be employed to the same effect. Other deposition methods that may be employed include plasma enhanced chemical vapor deposition (PECVD), chemical vapor deposition (CVD), physical vapor deposition (PVD), and atomic layer deposition (ALD). A spin on first sacrificial layer 110 may flow over any irregularities in the underlying layers, thereby producing a flat layer where the thickness of the film depends on the height of the underlying material.

Figure 1C:
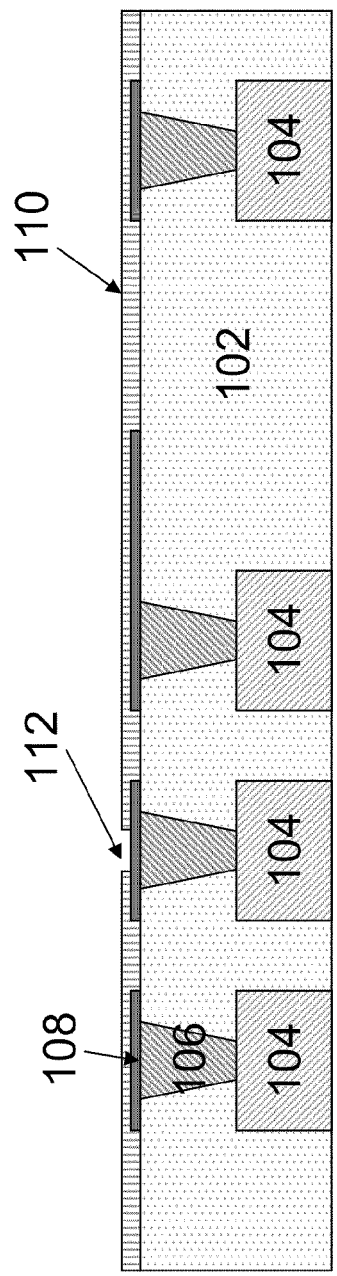
Figure 10:
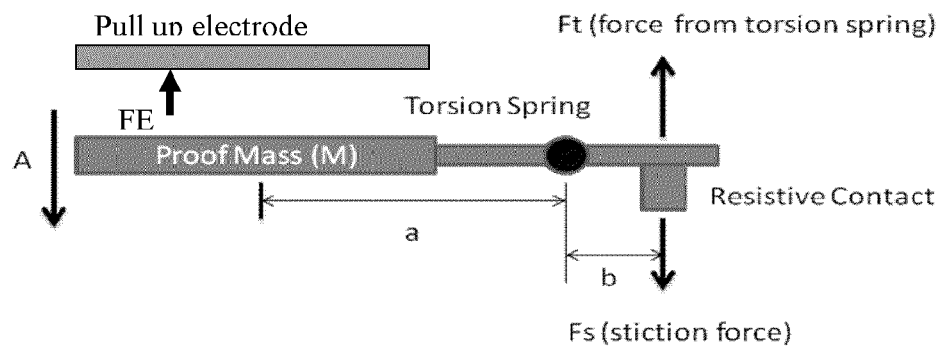
FIG. 10 is a diagram of an asymmetric switch according to another embodiment.

FIG. 1C shows the result of the third step of the method. The third step comprises the patterning of a via structure 112 in the first sacrificial layer 110 to form an interconnect from the underlying CMOS to the anchor point of the cantilever device. FIG. 10 shows the result of the fourth step of the method, which comprises the deposition of a conductive layer on top of the first sacrificial layer 110. In one embodiment, the conductive layer may comprise titanium nitride. In other embodiments, the conductive layer may comprise a titanium aluminum compound, a titanium aluminum nitride compound, polysilicon, silicon, any conductive material, and combinations thereof. In another embodiment this layer may be made of a combination of conducting and insulating parts. The conductive layer will form the cantilever of the cantilever device. Once deposited, the conductive layer may be patterned using conventional lithography and etch processes in order to form the shape of the cantilever 114. In one embodiment, the conductive layer is patterned by depositing a photoresist layer thereon, exposing the photoresist, developing the photoresist, removing the developed (or undeveloped photoresist) to form a mask, and then exposing the conductive layer through the mask to an etchant to remove undesired portions of the conductive layer. Thereafter, the mask may be removed. In one embodiment, a hard mask may be used.

FIG. 1E shows the result of the fifth step of the method, which comprises coating the wafer surface with the second sacrificial layer 116 in order to cover the patterned cantilever 114. The depositing of this second sacrificial layer 116 effectively seals the MEMS element prior to the creation of the micro-cavity. The second sacrificial layer 116 may be deposited in a manner similar to the method of depositing the first sacrificial layer 110. Additionally, the second sacrificial layer 116 may comprise one or more of a high temperature spin-on organic film, silicon nitride, silicon dioxide, amorphous silicon or amorphous carbon. In one embodiment, the second sacrificial layer 116 may comprise the same material as the first sacrificial layer 110. In another embodiment, the second sacrificial layer 116 may comprise a material different than the first sacrificial layer 110.

FIG. 1F shows the result of the sixth step of the method, which comprises the patterning of the first sacrificial layer 110 and the second sacrificial layer 116 in order to form the shape of the micro-cavity 118. The shape and dimensions of the patterned micro-cavity 118 depend on the structure which is to be fabricated. The first sacrificial layer 110 and the second sacrificial layer 116 may be patterned by conventional lithography and etching methods. For example, a photoresist layer may be deposited over the second sacrificial layer 116. Then, the photoresist may be exposed and developed. Thereafter, the developed (or undeveloped) photoresist may be removed to form a mask. Then the second sacrificial layer 116 may be exposed to an etchant through the mask to remove undesired portions of the second sacrificial layer 116. The first sacrificial layer 110 may be etched in the same step as the second sacrificial layer 116. For example, if the second sacrificial layer 116 and the first sacrificial layer 110 comprise the same material, the same etchant may be used. However, if different materials are used, then different etchants may be needed to etch the separate layers.

Figure 1D:
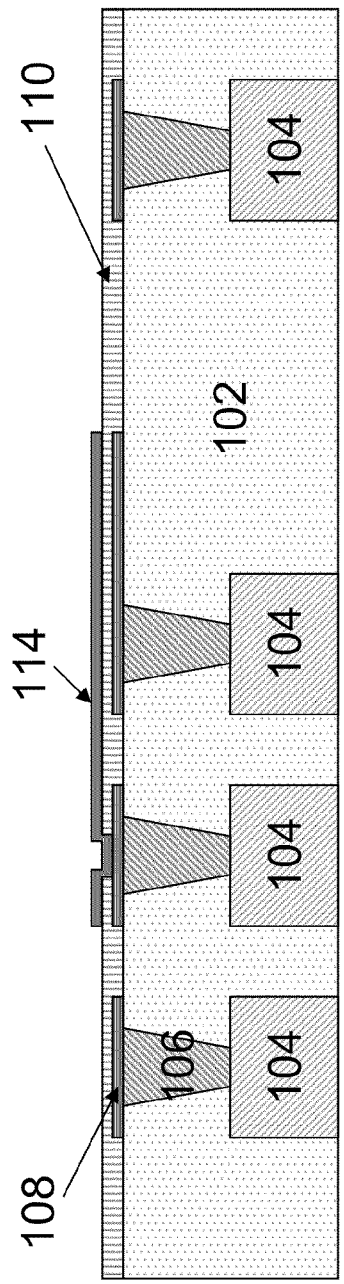
Figure 1G:
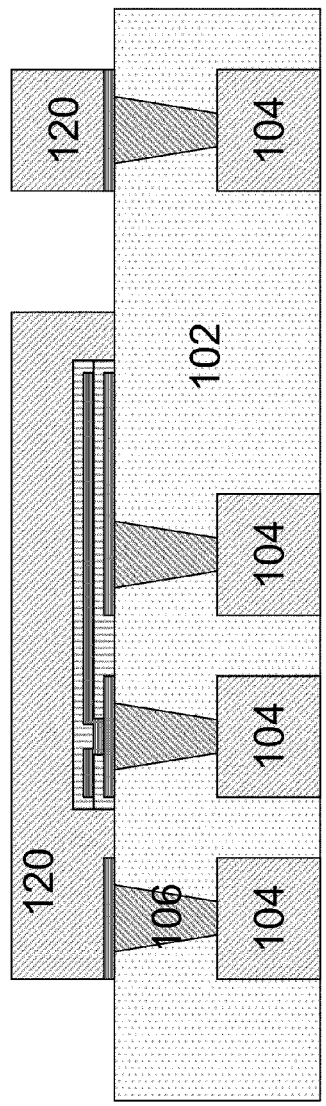

FIG. 1G shows the result of the seventh step of the method. In the step, the CMOS BEOL flow is continued and the next metal layer 120 is deposited. The metal layer 120 may be blanket deposited over the CMOS BEOL and the patterned second sacrificial layer 116 followed by an etching process. In one embodiment, the metal layer 120 may be pattern deposited through a mask. The metal layer 120 may be in contact with one or more electrodes 108 as well as the dielectric layer 102. Prior to patterning the metal layer 120, the metal layer 120 may encapsulate the micro-cavity 118. Once deposited, the metal layer 120 is then patterned and etched using conventional lithography and etch processes discussed above. Following the patterning and etching of the metal layer 120, the metal layer 120 may be in contact with an electrode 108 outside of the cavity area 118 to provide the electrical connection to metallization layers to be formed above the micro-cavity 118. Additionally, the metal layer 120, after etching, may have one or more openings through the sidewalls that are filled with either the second sacrificial layer 116, the first sacrificial layer 110, or both. The opening in the sidewall permits an etchant to reach the micro-cavity 118 and remove the first and second sacrificial layers 110 and 116. In another embodiment, portions of either the second sacrificial layer 116, the first sacrificial layer 110, or both may extend beyond the sidewalls of the metal layer 120 as release tabs.

Figure 1H:
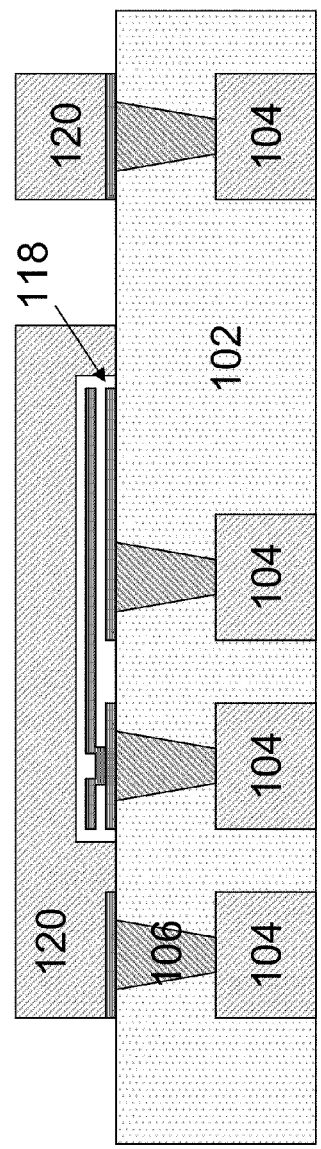

The result of the eight step of the method is shown in FIG. 1H. This step comprises the removal of the patterned sacrificial layer from the wafer surface in order to leave the freestanding MEMS device. In one embodiment, the first sacrificial layer 110 and the second sacrificial layer 116 may be removed using a dry plasma etch. In another embodiment, the first sacrificial layer 110 and the second sacrificial layer 116 may be removed using the same etchant. In another embodiment, the first sacrificial layer 110 and the second sacrificial layer 116 may be removed using different etchants. The etchants used to remove the first sacrificial layer 110 and the second sacrificial layer 116 may be the same etchants used to pattern the first sacrificial layer 110 and the second sacrificial layer 116. The etchant or etchants are delivered to the first sacrificial layer 110 and the second sacrificial layer 116 through the sidewalls of the metal layer 120 or directly to release tabs.

In one embodiment, the sacrificial layers 110, 116 may be removed by etching a hole through metal layer 120 to expose a portion of one or more of the sacrificial layers 110, 116. The hole may be through the metal layer 120 such that a release hole is formed through the top of the micro-cavity 118. In another embodiment, the metal layer 120 may be patterned such that the sacrificial layers 110, 116 are exposed from the top, but off to the side of the micro-cavity 118. In another embodiment, the metal layer 120 may be patterned such that the sacrificial layers 110, 116 are exposed from the side of the micro-cavity 118.

Figure 1I:
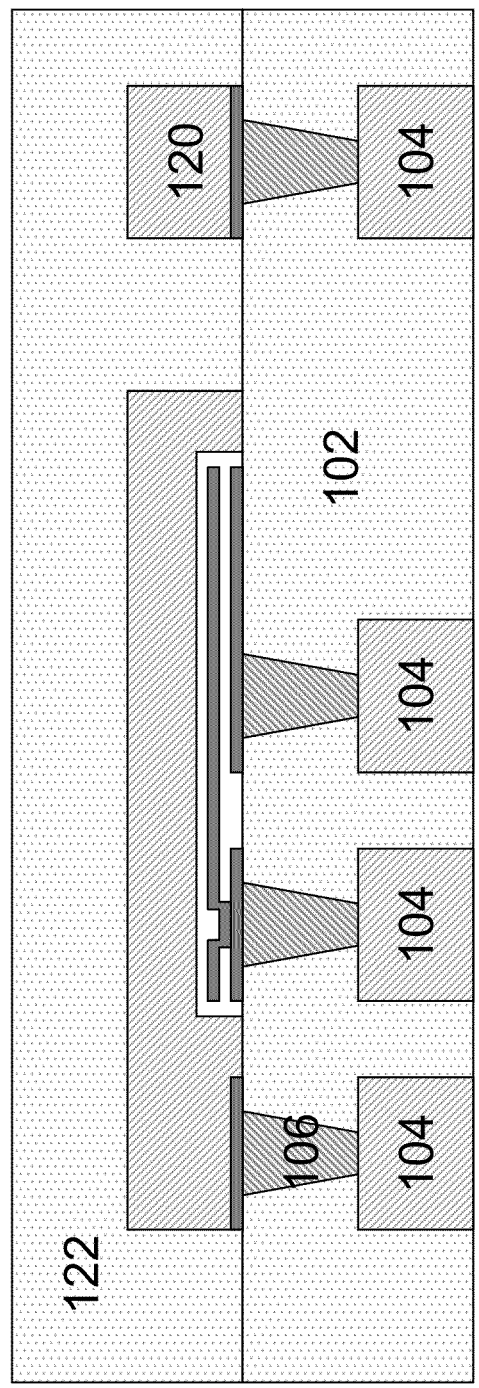

FIG. 1I shows the result of the ninth step of the method. This step comprises depositing an IMD or dielectric layer 122 in order to effectively seal the fabricated micro-cavity 118 within the CMOS BEOL. The dielectric layer 122 may comprise silicon dioxide. The dielectric layer 122 seals any openings into the micro-cavity 118 to encapsulate the cantilever. As will be appreciated, the final shape of the micro-cavity 118 is dependent upon the structure which is to be contained within it. The height of the micro-cavity 118 is less than the total height of the dielectric layer 122 such that the micro-cavity 118 fits within the dielectric layer 122. Therefore, the micro-cavity 118 may be formed in a structure without altering the process flow for later metallization layers. By fitting the micro-cavity 118 within the dielectric layer 122, no additional processing above the dielectric layer 122 is necessary than would occur in absence of the micro-cavity 118. In some embodiments the cavity may take up a height of more than one interlayer dielectric. The subsequent metal layers can then run on top undisturbed.

Figure 2A:
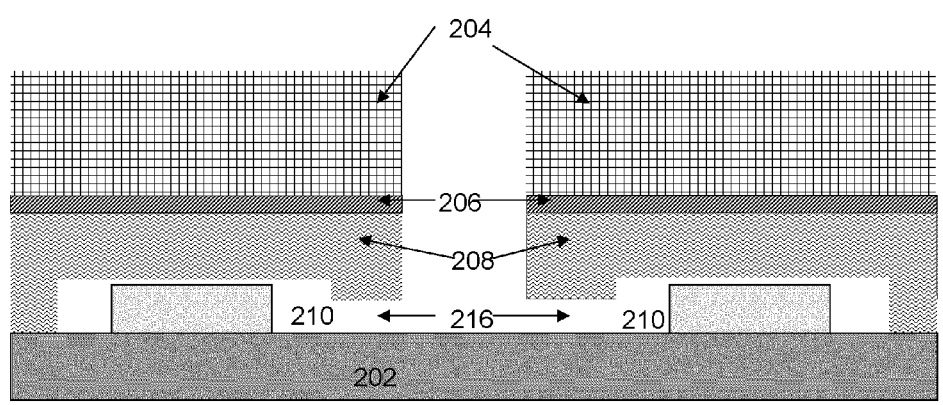
FIG. 2A is a schematic cross sectional view of a structure prior to sealing the cavities.

In FIG. 2A, both the substrate 202 and layer 204 will be sputter etched, while layer 206 and layer 208 may be sputter etched during the initial stages of the process until the surfaces are adequately coated by the sputtering and redeposition of layers 202 and 204. The resulting material will be redeposited in order to seal the cavity 210, thereby forming a redeposition layer. In one embodiment, the layer 204 may comprise a hard mask layer. The substrate 202 is locally sputter-etched at the bottom of the release hole. Material from layer 204 may also be sputter etched. The material from layer 204 may be redeposited onto the substrate 202 and along the sides of layers 206, 208 within the trench. The redeposited material from layer 204 may also sputter etch and help seal the cavity 210. Thus, the material that may seal the cavity 210 may come from the substrate 202, the layer 204, or even layers 206 and 208. In other words, the material that seals the cavity 210 comes from material already present on the structure at the time the sealing is initiated. A separate deposition such as CVD or even sputtering from a secondary source such as a sputtering target separate from the structure or gaseous precursors is not necessary. The substrate material may be chosen to suit the requirements of the redeposition layer. In one embodiment, the substrate material may comprise an oxide. In other embodiments, the substrate material may comprise silicon nitride, a metal, polysilicon, and combinations thereof.

Figure 2B:
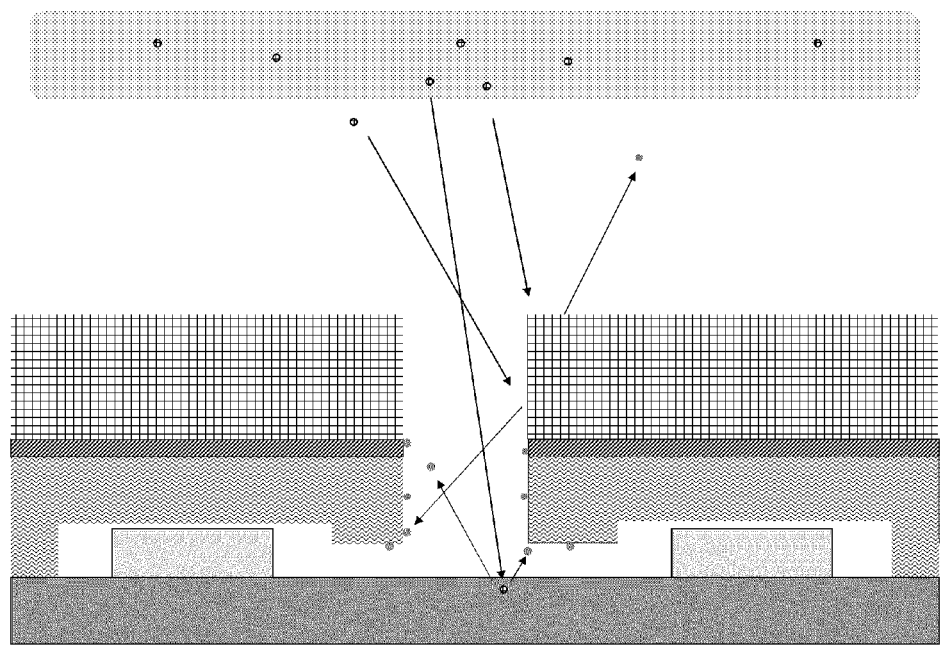
FIG. 2B is a schematic cross sectional view of the structure 2B during a sputter etch process.

As shown in FIG. 2B, the plasma is located away from the substrate 202. Thus, the gases used for sputter etching should not be accelerated toward the external target but toward the substrate 202. This can be performed on an apparatus where the substrate 202 can be negatively biased, for example when a RF bias is applied to it, with respect to the plasma.

Some of the sputtering gases are ionized in the plasma and accelerated toward the substrate 202. The materials being in the line-of-sight of these accelerated particles will be sputter etched (or sputtered) when the accelerated particles will reach the surface. They will then be expelled in different directions. Some of the expelled particles will be emitted back into the plasma, others will be redeposited on the sidewall and on the passage entrance.

Figure 2C:
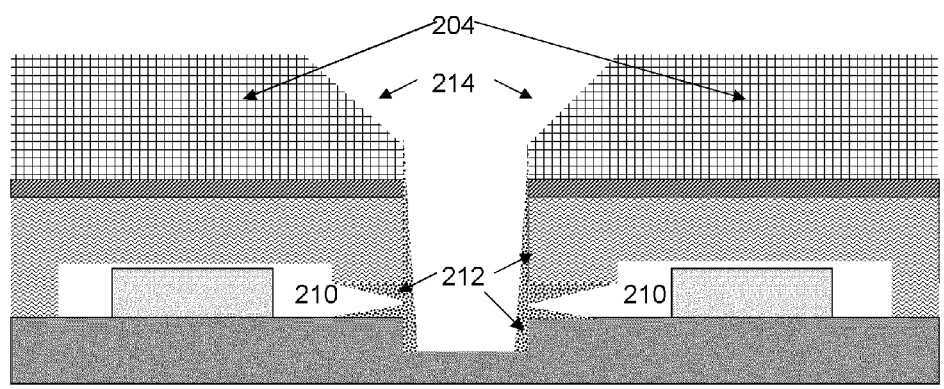
FIG. 2C is the structure of FIG. 2A after sealing the cavities.

FIG. 2C shows a plurality of cavities 210 sealed with material 212 that has been redeposited after sputter etching. The substrate 202 has been locally sputter-etched at the bottom of the via-like structure. In one embodiment, the substrate 202 provides most of the material 214 being redeposited toward the sidewall and the passage 216. The substrate material can be chosen depending on the requirements for the redeposited layer.

Layer 204 would also be sputter etch redeposited. Care should be taken in determining the material and thickness of the top layer of the multilayer stack as it would undergo most of the ion bombardments that occur during the sputter etching. Because the sputter etch rate is angle dependant, some facets 214 may form at the corner of the layer 204. These facets 214 will move further away from one another as the sputter etch pursues. However, at a point of time, enough material would have been deposited at the passage 216 to close it. An etch stop layer having a low sputtering rate can be used under layer 204 if desired. This would avoid etching layer 208 if required and limit the amount of faceting occurring during sputter etching. It can also be used to tune the ratio of resputtered material coming from the top versus the resputtered material coming from the bottom if necessary. Because the sputter etching occurs in an inert atmosphere, the cavity will be filled with inert gases rather than deposition gases.

An embodiment of the present invention to implement an accelerometer would consist of a multitude of asymmetric rotating switches where each switch acts as the proof mass with torsion elements acting as the suspension members. Making each switch asymmetric with respect to the torsion legs allows for inertial loads (accelerations) to create reaction moments about the center of rotation (torsion leg axis). A simple free body diagram of the asymmetric switch is shown in FIG. 3.

Figure 3:
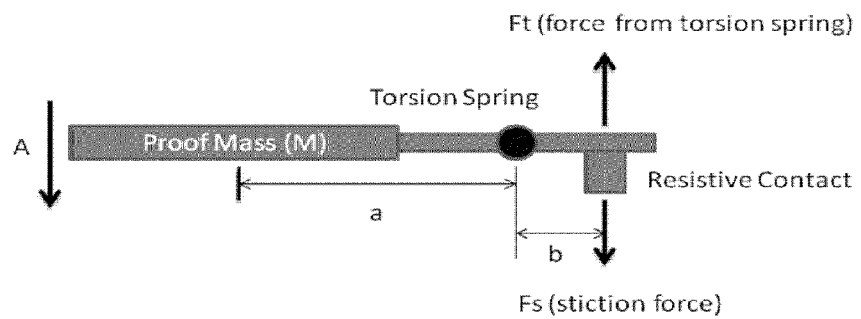
FIG. 3 is a diagram of an asymmetric switch according to one embodiment.

Referring to FIG. 3, this is a schematic diagram of an individual accelerometer in the array. A proof mass on the left is free to rotate about the torsion spring under the acceleration A. The centre of mass of the proof mass is a distance a away from the point of rotation. The contact bump is on the right and there is a restoring torsion moment with a lever arm of length b from the torsion point and a torsion force Ft.

Figure 4:
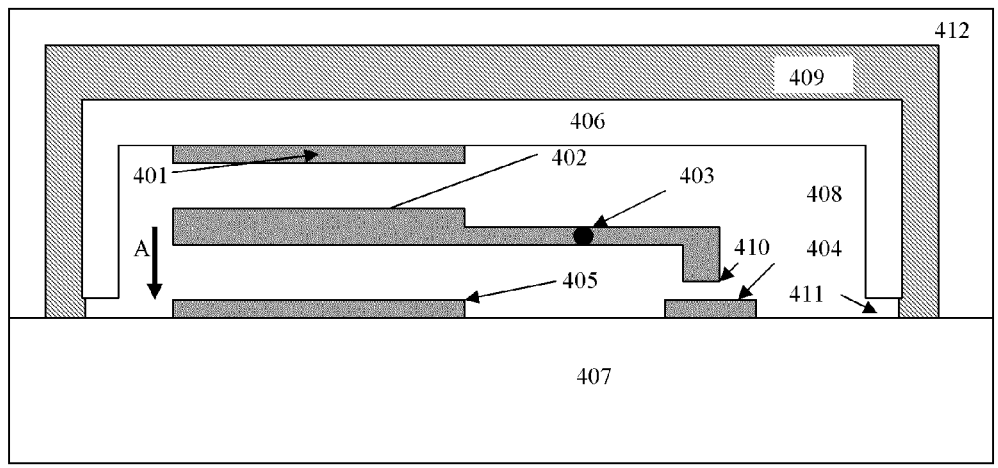
FIG. 4 is a diagram an accelerometer of an array housed in a micro-cavity.

Referring to FIG. 4, this is a diagram of one of the accelerometers of the array housed in a micro-cavity 408 which has a low pressure of gas inside. Electrode 401 is a pull up electrode for the proof mass. Electrode 405 is a pull down electrode that allows the accelerometer to be reset by pulling the contact 410 off the landing electrode 404. The touch down of the accelerometer is sensed by measuring the contact resistance between electrode 404 and contact 410. Electrical contact is also made to the contact 410 and proof mass via the torsional spring arm 403. The device is housed in a cavity which has a roof and walls 406 fabricated on sacrificial layers which can be removed with a gas etch through release channels 411. These release channels are sealed with deposition layer 409. The device sits on the interlayer dielectric 407 of the underlying CMOS chip and the cavity is embedded in the next highest level of interlayer dielectric 412.

From FIG. 3, acceleration (A) of the proof mass (M) causes a moment about the torsion spring axis that adds to the moment stored in the torsion springs. The stiction force (Fs) creates an opposing moment. A simple moment balance about the torsion axes yield the following condition for a switch to remain open or closed. The switch becomes open when:

$$M*A*a+Ft*b>Fs*b$$

The switch remains closed when:

$$M*A*a+Ft*b<Fs*b$$

The degree of asymmetry (ratios of a & b) and the size of the mass along with the design of the torsion legs (Ft) and contact adhesion (Fs) become design parameters to achieve the desired range of the sensor.

To sense small accelerations, it is preferred to adjust the torsion legs to produce a pull away force (Ft) at or near the expected value of the contact adhesion (Fs). In this manner, approximately 50 percent of the total number of switches in the array will spontaneously release (act as a volatile switch) after the entire array is electrostatically forced closed. The remaining 50 percent of the switches would stay closed (i.e., act as a non-volatile switch). The 50 percent number is a result of the normal distribution of values of (Ft) and (Fs) of the entire array of switches.

Figure 5:
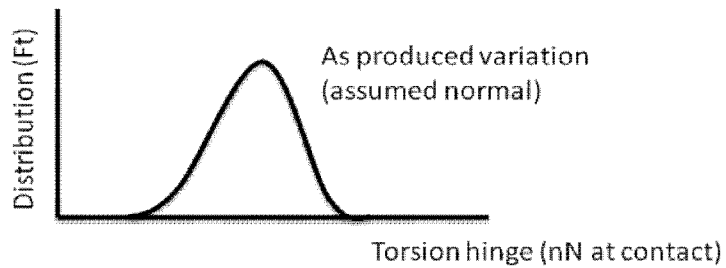
FIG. 5 is a diagram of the expected distribution of variation for a torsion hinge.

The torsion legs, for example, would have a distribution for (Ft) as shown in FIG. 5 which shows the distribution of pull up forces at the contact due to variations in the torsion hinge. This variation is produced from small variations in etch dimensions of the legs, variations in the spacer height between the switch and the contact electrode, and variations in the metal deposition thickness and composition used to create the legs. These variations combine together to create an overall variation of the stored strain energy in the torsion leg which in turn creates a variation in the force the legs exert on the contact.

Figure 6:
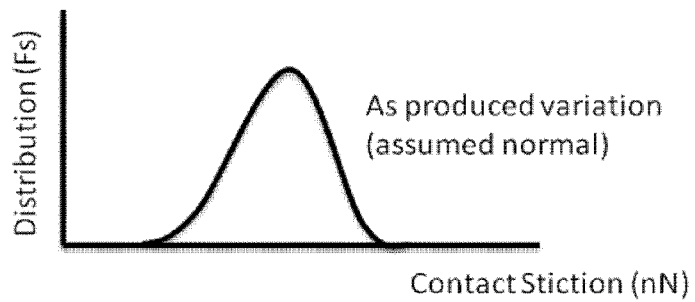
FIG. 6 is a diagram showing the distribution of variation as a function of contact stiction.

The contact adhesion would have a similar distribution as shown in FIG. 6 which shows the distribution in the stiction force as a result of variations in the morphology of the contact. This contact adhesion variation is a result of the size and shape of the contact area. The materials used in the contact as well as the surface roughness of the contact. The voltage and/or amperage used to read the contact could contribute to this variation. Contact conditioning may be used as another technique to manipulate the adhesion distribution.

Contact conditioning is a process whereby the surface roughness and contact cleanliness can be altered by pulling the cantilever so that it makes contact with the landing electrode and then increasing the pull in voltage further which causes the surfaces to be pushed to more intimate contact. This causes more asperities on one surface to adhere to the other resulting in a larger adhesion force. The distribution of the difference between the switch mechanical characteristics and the contact surface adhesion is also normal with a wider standard deviation.

Figure 7:
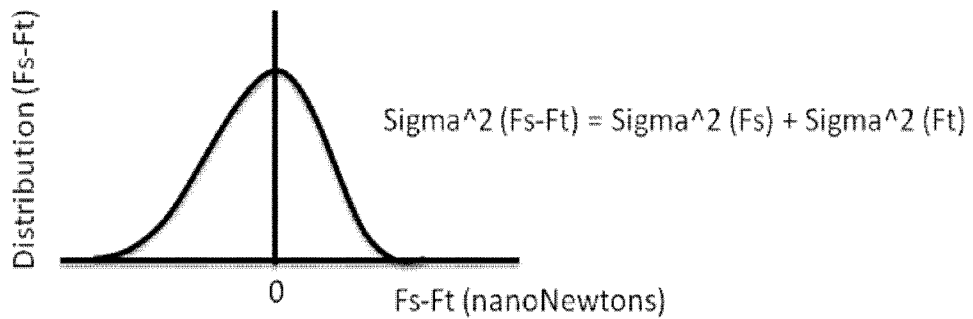
FIG. 7 shows the combined distribution of the pull off force due to the variation of the adhesion force and the variation of the spring constant of the torsion arm.

FIG. 7 shows the combined distribution of the pull off force due to the variation of the adhesion force and the variation of the spring constant of the torsion arm. The resolution of the sensor array is then the width of the difference distribution divided by the total number of switches in the array. For example, if an individual switch can resolve a shock of 10,000+/−1,000 Gs in the digital sense (i.e., closed to open condition is met) then 10000 switches all centered around the same conditional state can resolve G levels in the 10,000+/− 0.1 G range.

Figure 8A:
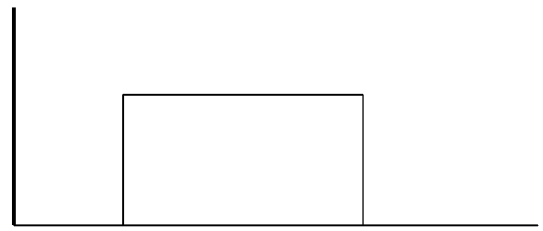
FIG. 8A shows the distribution of Ft by design.
Figure 8B:
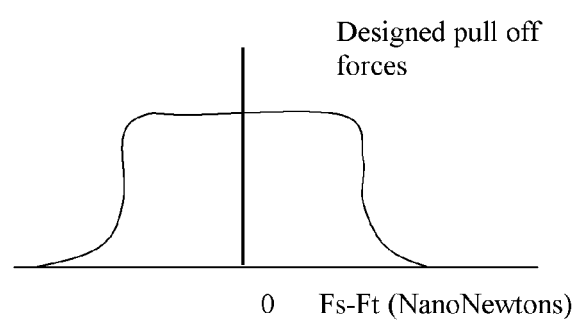
FIG. 8B shows the distribution of Fs-Ft including design variations.

The width and even shape of this distribution can also be controlled by changing the design of each cantilever so that they are not designed to be the same. With a whole range of different cantilever designs the distribution can be made to be a wider normal distribution for example or a different shaped distribution as illustrated in FIGS. 8A and 8B. FIG. 8A shows the distribution of Ft by design. FIG. 8B shows the distribution of Fs-Ft including design variations.

The trace in FIG. 8A shows an example of the distribution function for pull off forces that could be created by design changes over the array of cantilever. The curve in FIG. 8B shows the distribution in pull off forces taking the designed variation in torsion pull off force into account as well as the random variation in the torsion force due to the normal variations in the fabrication process and the random variations in adhesion energies due to the variations in surface morphology of the region of the cantilever that sticks and un-sticks during operation.

All the sources of variation described so far are time invariant and produced during the construction of the array or ensemble. If some of the variations in contact adhesion to vary with time, the actual sampled resolution will be lower than theoretical. Contact conditioning is an example of variation that may change with time. Contact aging could also contribute to this variation.

Figure 9:
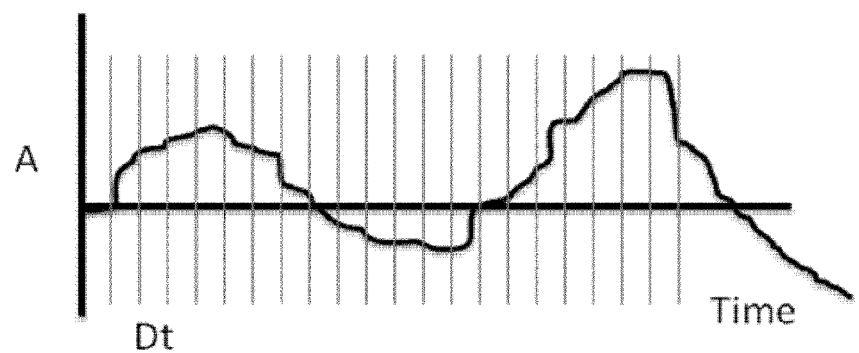
FIG. 9 shows the measured acceleration at different time intervals for one embodiment.

In the first operation embodiment, the array of switches would be set to the closed state at the start of the sample period and then read again at the end of the sample period. By performing the sampling at a rate faster than the highest frequency of interest in the analog inertial input signal, an accurate representation of the input can be achieved (sample & hold technique) as shown in FIG. 9 where the measured acceleration at different time intervals is shown.

The output of the switch array is always a digital signal by its very nature so an automatic analog to digital conversion is achieved. An example of this conversion is shown in Table I:

TABLE I

| Time Step (DT) | Percentage of switches open | Percentage of switches closed | Digital Difference (10,000 switches) |
| --- | --- | --- | --- |
| 1 | 50% | 50% | 0 |
| 2 | 60% | 40% | 2000 |
| 3 | 66% | 34% | 3200 |
| 4 | 49% | 51% | −200 |
| 5 | 38% | 62% | −2400 |

Calibration of the digital response during final test may be required as produced however; self calibration in the field is also easily performed during power-up. Biasing a section of the array to have more asymmetry through changes in the torsion legs, contact area, or any of the other design parameters can be used to artificially widen the difference distribution if a greater range of accelerations are needed. Increasing the number of switches can be used to produce a great sensitivity. This basic technique of using a switch array to sub-sample a difference distribution of adhesion can be extended to measure analog voltages as the input signal by sampling the voltage on the pull-in electrode.

An alternative embodiment of the present invention to implement the array accelerometer would have the same design as in the previous embodiment, but each switch would be held in the off state. The advantage of this embodiment is that the distribution in adhesion energy is no longer present and so the distribution can be made narrower. Then, an additional electrostatic force (FE), caused by a pull in voltage, is applied to the tuning electrode to bring the cantilever close to switching. At this point the cantilever will switch when the chip is subject to a small acceleration. Again because of the distribution in the array turn on voltage, the number of switches switching will be a measure of the level of acceleration. The switch becomes closed when:

$$FE*a - M*A*a > Ft*b$$

In this case if the acceleration is negative (i.e., up), then the cantilever will switch. The switch remains open when:

$$FE*a - M*A*a < Ft*b$$

With no voltage is applied, the cantilever sits in an energy well which is parabolic in nature. The torsion restoring force is linearly dependent on displacement angles for small displacements. An acceleration must be large enough to move the torsion cantilever until the contact 410 is made to a landing electrode 404 on the right hand side of FIG. 4. When this contact is made the adhesion forces keep the cantilever in the on state, where the resistance is measured and the cantilever is said to have switched. This cantilever can then be electrostatically reset with a voltage applied to an electrode under the left hand arm (electrode 405 FIG. 4). The cantilever is now reset and can measure the next acceleration force.

Because these small cantilevers have a small mass the electrostatic switching time can be very quick allowing the cantilever to be reset in 200 ns. This off time is very small in comparison to most mechanical vibration frequencies that may need to be measured. By adding an additional electrostatic force by grounding the cantilever and applying a pull up voltage on electrode 401 shown in FIG. 4, the cantilever is rotated so that the cantilever has less distance to be accelerated across before it sticks to the landing electrode. In this way, the sensitivity of the cantilever can be electrically controlled. With a constant voltage difference between the pull up electrode and the cantilever proof mass, the attractive force increases as the cantilever proof mass gets closer to the pull up electrode because the electric field increases. The restoring force from the torsion arm is linearly dependent on this distance, so this pull-up voltage effectively also reduces the restoring force. This makes the movement of the proof mass greater for the same external acceleration which also increases the sensitivity of the individual accelerometer, or alternatively we can say the pull up voltage on electrode 401 reduces the spring constant of the cantilever.

A simple model of the force on a cantilever of length L and width w with a gap d0 that deflects by a distance x and has a spring constant of the cantilever k is given by:

$$F_{Total} = mA(t) + \frac{\varepsilon L w}{2(d0-x)^2} V^2 - kx$$

where V is the applied voltage on electrode 401. This produces an effective spring constant:

$$k_{Eff} = k - \frac{\varepsilon L w}{(d0-x)3} V^2$$

Increasing the magnitude of the voltage on electrode 401 will reduce the effective spring constant of the cantilever making it more sensitive to acceleration as well as moving the cantilever closer to the landing electrode, so that less movement is required before switching.

The advantage of operating in this mode is that time or switching dependent change in the adhesion force does not cause a change in the sensitivity. The device can be operated in two manners.

In a first manner, a pull in voltage is applied so half the cantilevers pull in, and then the acceleration causes extra cantilevers to turn on. The number switching is then recorded and all the cantilevers reset and pulled in so that half the cantilevers are on. The cantilevers are then pulled off and half pulled in. This process is repeated continuously in the same sample and hold technique as above. Initially the voltage required to switch half the cantilevers on with no acceleration applied is ascertained during the manufacturing process and this voltage is stored on chip.

In a second manner, all the cantilevers are pulled in and the threshold of each is logged. Then all the cantilevers are pulled in again and the threshold shift of each is measured again. The total shift in threshold voltage is then a measure of the acceleration and this can be measured with a precision that is $\sqrt{N}$ better than the precision that one cantilever can be measured.

The above techniques require the cantilevers to switch at a very high rate, though the sensitivity of measurement is very high because the sensing uses the change of resistance between the on state which can be 1 to 10 K Ohms and the resistance of the off state which will be greater than 10 M Ohms. Such a change in resistance can be measured in 100 ns quite easily. This means that the state of the cantilever can be measured and reset in less than 200 ns giving a band width of more than 1 M Hz. Given that most mechanical accelerations that need to be measured are 10 K Hz or less this allows the acceleration to be measured over 100 times to give and additional sensitivity improvement of at least 10.

Another embodiment of the present invention of using an array of smaller cantilevers to measure acceleration instead of one larger cantilever is to measure the change in capacitance between all the proof masses and all the electrodes like electrode 1 under them. This is adding N capacitances in parallel which makes it N times bigger. The fundamental limit on measurement is given by thermal vibrations of the cantilever. This is true for a large accelerometer and it would also be the case for N small cantilevers acting in parallel. The movement of the cantilever is sensed using the change in capacitance between the proof mass and a fixed electrode. As the capacitance is linearly dependent on the change in gap then the movement and thus acceleration can be deduced from the change in capacitance. A differential capacitance sensing circuit as used for single large cantilevers could equally be used for N small cantilevers measured as capacitors in parallel.

One of the fundamental limits on the sensitivity of an accelerometer is given by the thermal activation of vibrational modes. The mean square force noise is given by $\sqrt{4k_BTB}$ where B is the damping term for a spring dashpot model. This can be described in terms of the resonant frequency $\omega_0$ (which is equal to K/m where K is the spring constant and m the mass of the cantilever) and Q the quality factor (which is described by $$\frac{m\omega_0}{B}).$$

The displacement is proportional to the acceleration and inversely proportional to the square of the resonant frequency.

$$x = \frac{a}{\omega_0^2}$$

Thus the Brownian motion noise will lead to acceleration noise given by:

$$a_{RMS} = \sqrt{\frac{4k_BT\omega_0}{mQ}}$$

For a single large cantilever with a 20 kHz resonant frequency and a mass of $2 \times 10^{-10}$ kg and a Q of 5 set by squeeze film damping, the sensitivity will be $5 \times 10^{-3}$ m/(s² $\sqrt{Hz}$).

For a simple cantilever of length L, width w and thickness t we can rewrite this as:

$$\omega_0 = \frac{3.52}{L^2}\sqrt{\frac{EI}{(m/L)}} \approx \sqrt{\frac{Et^2}{\rho L^4}}$$

Inserting this equation into the $a_{RMS}$ equation, we get for $a_{RMS}$:

$$a_{RMS} = \sqrt{\frac{4k_BT\omega_0}{mQ}} = \sqrt{\frac{4k_BT}{Q}} \cdot \left(\frac{E}{\rho^3 w^2 L^6}\right)^{1/4}$$

For a plate of width $w_1$ and length b, the mass moment of inertia i about one end is given by $(\frac{1}{3})mb^2$. We can approximate the mass moment of inertia of the proof mass about the rotational axis that runs through the torsion arms as $(\frac{1}{3})mb^2$.

The spring constant of one of the two torsion springs, which consist of a beam of length L width $w_2$ and thickness $t_2$ is:

$$k = \frac{Gw_2t_2(w_2 + t_2)}{12L}$$

where G is the shear modulus (119 G Pa for TiN). The resulting resonant rotation frequency about the center of rotation is:

$$f = \frac{1}{2\pi}\sqrt{\frac{2k}{i}}$$

where there are two torsion arms, one on each side.

With regard to the top view of the device defined below we can use the following dimensions: L=4 microns, $w_2$=0.5 microns, and $t_2$=30 nm. For the proof mass, the thickness t=0.5 microns, the width w=4 microns, and length of the proof mass b=4 microns. For these values the resonant frequency is 1.6 M Hz. The mass of the proof mass would be $4.4 \times 10^{-14}$ kg using $$a_{RMS} = \sqrt{\frac{4k_BT\omega_0}{mQ}}$$

This gives a thermal noise for the acceleration of 0.87 ms$^{-2}$/$\sqrt{Hz}$ for a Q of 5. Changing these values only slightly to L=4.5 microns, $w_2$=0.35 microns, and $t_2$=30 nm.

For the proof mass, the thickness t=0.5 microns, the width w=4 microns, and length of the proof mass b=5 microns, then we get a resonant frequency of 618 KHz with a proof mass of $6 \times 10^{-14}$ kg. This gives a thermal noise for the acceleration of 0.5 ms$^{-2}$/$\sqrt{Hz}$.

Figure 11:
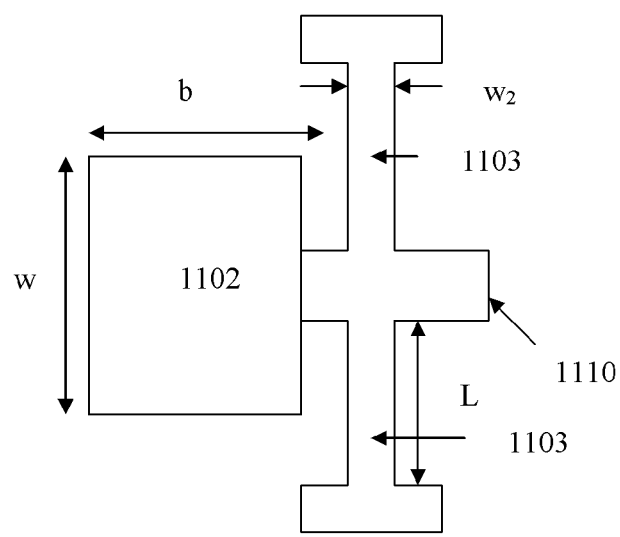
FIG. 11 is a top view of a torsion cantilever with the two torsion side arms and a large proof mass.

FIG. 11 is a top view of the torsion cantilever with the two torsion side arms 1103 and the large proof mass 1102 to the left shown. The landing contact 1110 is to the right. This is for one cantilever. For N cantilevers this would improve by $\sqrt{N}$. The earlier single large accelerometer example is for an accelerometer of the order of 450 microns by 450 microns. If we can fit the device in an area of 10 by 8 then we fit 2,000 devices in such an area. This would mean the noise levels would be a factor of 2 larger in our array when no bias voltage is applied.

Finally we could apply a pull in voltage to put us close to the switching point. This makes the potential minima the cantilever sits in more shallow (as discussed above), this further reduces the resonant frequency and reduces the acceleration noise allowing us to achieve the same sensitivity.

Thus, by design and operation, we reduce the resonant frequency to 200 KHz which would make the acceleration noise of each cantilever 0.1 m/(s² $\sqrt{Hz}$) or 10 mg/$\sqrt{Hz}$ per cantilever. Using $$x = \frac{a}{\omega_0^2},$$

that gives a maximum noise displacement of 1 nm. Given that we have a 30 nm gap this gives us a maximum acceleration that we can handle of 30 g when the device is not powered up.

It is useful to note that if we scale thickness, length, and width of a cantilever by β, then we can replace one large cantilever with β² smaller cantilevers then acceleration noise or minimum sensitivity of each cantilever will go up as $$a_{RMS} \propto \frac{1}{\beta^2}$$

However the number of cantilevers goes up as $\beta^2$ so the acceleration noise can be averaged out by a factor $\beta$. Thus scaling one large cantilever into N smaller ones leads to an increase in average acceleration noise of:

$$a_{RMS} \propto \frac{1}{\beta}$$

This dependence on scaling of the sensitivity can be offset partially as the quality factor is expected to improve with the loss of squeeze film damping for smaller gaps and by softening of the mode with an applied voltage and by a change of design to a torsion sensor.

Because of the scaling of the gap under the cantilever the same electric fields can be generated using lower voltages, which make it easier to electrically integrate with the native CMOS voltages.

A typical proof mass cantilever accelerometer coupled to interlocking finger capacitance sensing, would have a capacitance given by:

$$C \approx 100 fF \left[ 1 \pm \frac{y}{G_0} \right]$$

where y is the displacement and $G_0$ is the gap between fingers (about 1 micron). An estimate for the capacitance of a torsion device can be determined by setting $C = \epsilon wL/G$ and estimating the gap to change linear along the cantilever $G = d_0 + y \cdot x/L$. Integrating along the length, we get the total cantilever capacitance as a function of tip displacement y as:

$$C = \frac{\varepsilon_0 wL}{d_0} \cdot \frac{\ln(1 + y/d_0)}{y/d_0} \approx \frac{\varepsilon_0 wL}{d_0} \left( 1 - \frac{y}{2d_0} \right)$$

For the scaled cantilever array devices envisaged here we would have $$2000 \frac{wL\varepsilon_0}{d0}$$

where w is the width of the cantilevers, L the length and d0 the gap. With w=5 microns L=5 microns and d=300 nm, we get a total capacitance of:

$$C \approx 1300 fF \left[ 1 \pm \frac{y}{600 \text{ nm}} \right]$$

This is a factor of 5 larger than a standard accelerometer. Thus for each cantilever we have:

$$C \approx 0.65 fF \left[ 1 \pm \frac{y}{300 \text{ nm}} \right]$$

There is thermal noise leading to 1 nm displacements, and there will also be thermally generated electrical noise that may double this, so for an individual cantilever the minimum detectable capacitance would be (1/30) 0.6 fF. Or with N=2,000 cantilevers that would be 1 aF. Estimates for a single large cantilever with finger capacitance detection gives a value of 1 aF/nm for the capacitance noise, which matches the multi accelerometer array.

The capacitance would be measured using a differential technique. For vertical displacement the capacitance between the proof mass 402 in FIG. 4 and the top electrode 401 is one capacitor and the other is the capacitance between the proof mass and the electrode 405 at the bottom. By ensuring theses two capacitances have the same value by designing the areas and gaps appropriately, then we measure the small difference between these two in a bridge circuit.

Figure 12:
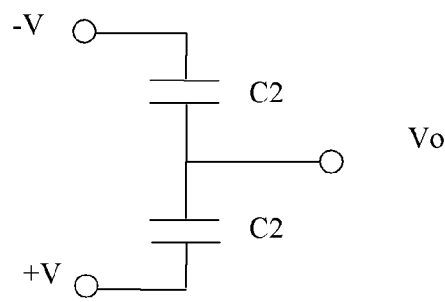
FIG. 12 is a schematic diagram of a circuit for an accelerometer according to one embodiment.

In FIG. 12, C1 is the capacitance between the proof mass 402 and the top electrode 401, while C2 is the capacitance between the proof mass and the bottom electrode 405. With a positive voltage on 405 and a negative voltage on 401, the output Vo is zero on balance. The output is then just proportional to the change in the position of the proof mass in the cavity.

Looking at noise contributions to arrays of cantilevers, it would appear that there is not a fundamental physics limit to making an array of cantilevers as sensitive an accelerometer as a single micro machined device, of the same area. Because the present invention allows embedding of MEMS devices, such as an accelerometer on an existing CMOS chip, there is a huge saving in space associated with all the periphery of bond pads and electronics which would make the device 10 times bigger as a stand alone chip.

We can make this device into a 3D accelerometer by using two layer metallization and hang vertical proof mass at one end of a torsion spring. This shifts the center of mass above the fulcrum allowing lateral accelerations to generate vertical movement at one end of the cantilever. With ⅓ of the array with the rotation axis at right angles to the other ⅓ of the cantilevers. The final ⅓ would be flat with the proof mass in plane. Then an acceleration in the x direction will only rotate those cantilevers with the rotation axis along the y axis that have a proof mass out of plane. The cantilevers with the rotation axis along the x axis with the proof mass out of plane will not be affected by acceleration along the x axis. With the cantilever with no mass out of plane will not be affected by lateral accelerations.

Figure 13:
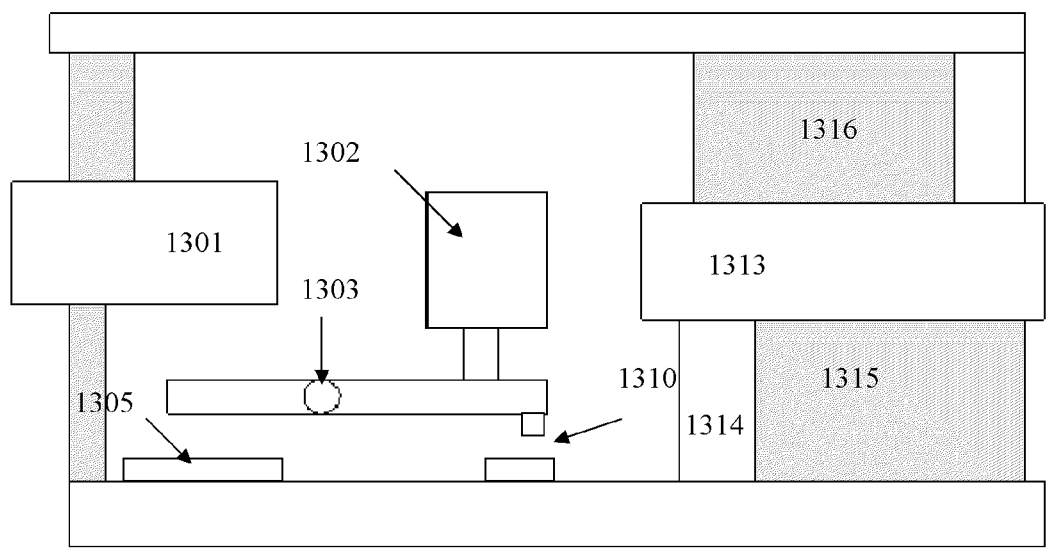
FIG. 13 is a schematic diagram of a small accelerometer from an array according to one embodiment.

FIG. 13 is an example of a small accelerometer from an array, which is sensitive to acceleration in the x-y plane parallel to the substrate. The accelerometer includes a pull up electrode 1301, the pull down electrode 1305, the proof mass 1302, the torsion arm 1303, the landing point 1310, the interlayer via for a standard back end metallization 1314, the interlayer dielectric 1315, and the metallization layer for a standard back end CMOS process 1313, the next interlayer dielectric 1316.

Advantages of the present invention include the capability to have fully integrated packaging into the BEOL of a semiconductor process as opposed to a separate package that is required now and noise immunity from the small size of each switch. Each switch in the array has a higher resonant frequency compared to a single large MEMS device, and so is less prone to vibration noise at low frequencies. Another advantage is integrated analog to digital conversion since the sampled switch count (digital) represents the magnitude of the input signal (analog). Another advantage is decreased cost over competing solutions because it can be embedded in the back end and does not need a separate package. Another advantage includes the device can be integrated with standard ICs because it can be encapsulated in the back end processing, which is not possible with the existing larger single MEMS devices.

By making the MEMS switches that form the capacitors smaller, the restoring forces per unit area can be made larger, because the restoring forces of a cantilever becomes larger as the cantilever is made shorter. The increased restoring force per unit area at the contact, helps prevent unwanted switching caused by high RF signals applied to the capacitor signal line. The AC voltages lead to an average attractive force that can be quite high. Larger MEMS switched capacitors can be pulled in more easily. It is also important to be able to pull the capacitor off the landing electrode when RF power is applied. The increased pull off force per unit area in the smaller MEMS switch helps with this as well.

Additionally, the device life may be extended by having a plurality of smaller switches rather than a single, large switch. Specifically, when there are a plurality of switches, the device may still function when one or more of the smaller switches ceases to function so long as at least one switch continues to function. However, when a single, large switch is used, the device is inoperable once the switch ceases to function. Thus, when a plurality of smaller switches are utilized, not only can the device performance be improved, but the device lifetime may be lengthened.

To solve the problem with being able to switch off the MEMS capacitor when RF power is applied larger MEMS RF capacitor devices need to introduce a voltage divider which complicates the design and increases the cost of production. By making the capacitors smaller with a greater pull off force per unit area this problem is solved.

Because each MEMS capacitor is smaller, it has a lower mass and can be switched more quickly. This gives a faster response time and quicker ability to tune the resulting RF signals. With a normal MEMS variable capacitor, the capacitance can be controlled by controlling the gap between a cantilever and the RF signal line. The resulting capacitor has noise associated with mechanical vibrations of the cantilever which is not present with a digital variable capacitor when it is fully switched on as the MEMS cantilever is then in contact with the dielectric layer over the RF signal line.

By breaking the capacitor up into an array of smaller capacitors, the yield can be improved. This is because if one MEMS device of the array of digital capacitors is not switching, the array will still provide a variable capacitor with a slight shift in the specifications. With one larger device, a problem with a point like defect can prevent the whole device from working, resulting in no capacitance change at all.

By making the cantilevers smaller, one can interconnect the devices inside the cavity which ensures that the stray capacitance and electromagnetic fields can be controlled. Because the capacitor has been broken up into an array of smaller cantilevers, there is a great deal of design freedom in the shape of the array. It can be set out in a long narrow array in-between the RF and Ground lines which helps reduce unwanted coupling from stray electromagnetic fields (i.e., the array can be fitted in a strip line arrangement). This would be very hard with a single capacitor as you do not have so much freedom in the aspect ratio of the design of a single MEMS cantilever capacitor.

Figure 14:
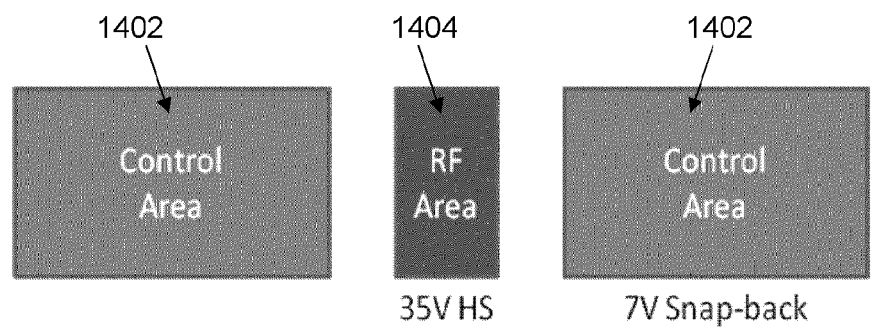
FIG. 14 is a schematic top view of control electrodes and an RF electrode according to one embodiment.
Figure 15:
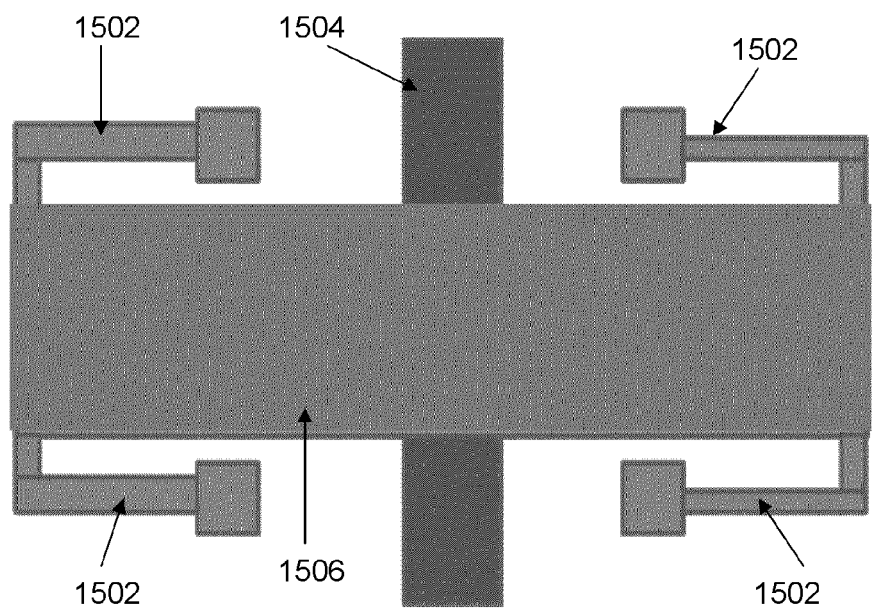
FIG. 15 is a schematic top view of a cantilever over control electrodes and an RF line according to one embodiment.

FIG. 14 is a top view of the control electrodes 1402 and the RF electrode 1404. FIG. 15 is a top view of the cantilever 1506 with four support arms 1502 over the top of the RF line 1504. The cantilever 1506 provides a path to ground and is shown over the top of the RF line 1504 and control electrodes. The control electrodes function at first and second electrodes while the RF line 1504 functions as a third electrode. The cantilever 1506 pivots or moves from a position spaced a first distance from the RF line 1504 to a second position spaced a second distance from the RF line 1504. The first distance is greater than the second distance. The distance between the RF line 1504 and the grounded cantilever 1506 creates a capacitance. The smaller the distance between the RF line 1504 and the grounded cantilever 1506, the greater the capacitance.

Figure 16:
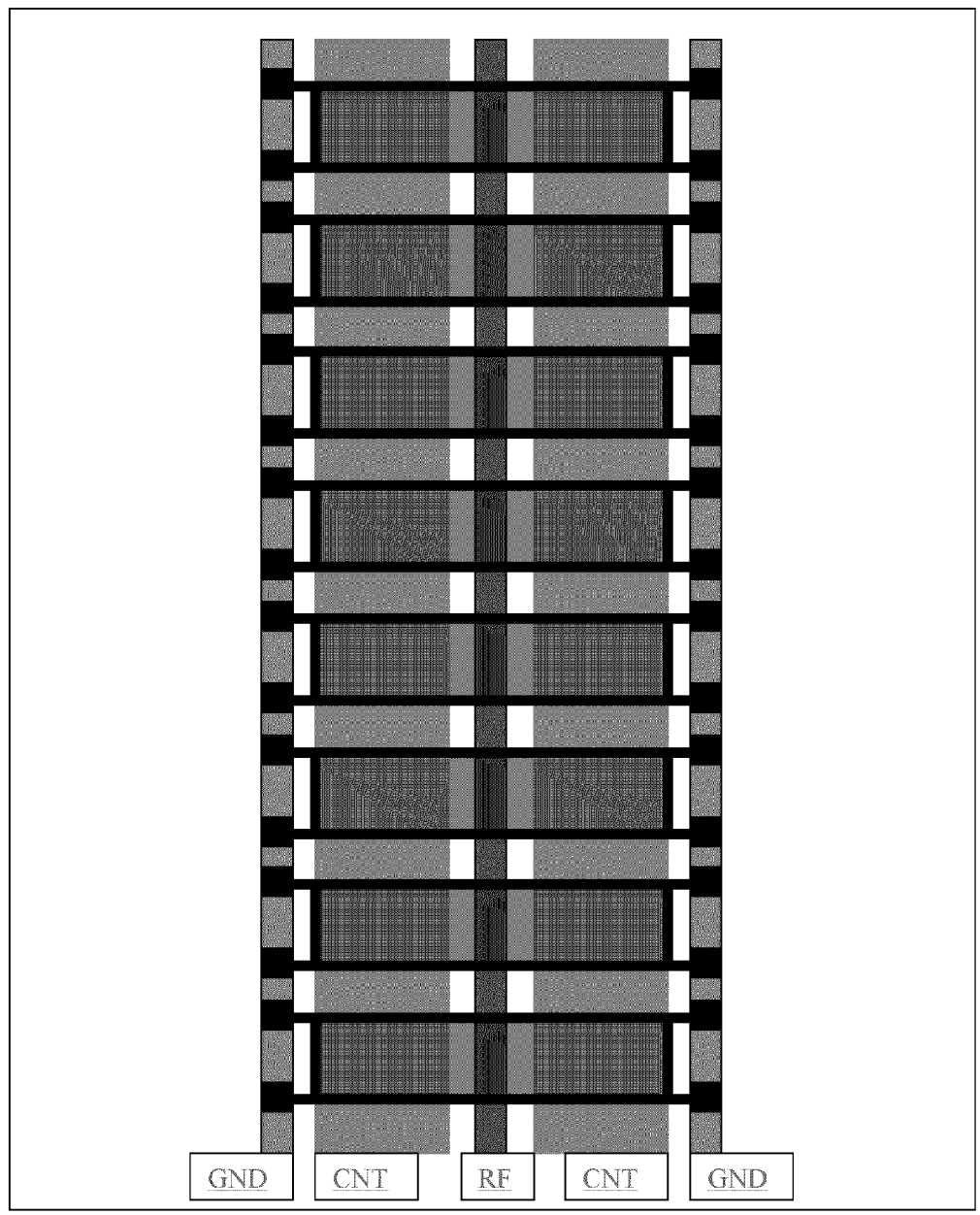
FIG. 16 is a schematic top view of multiple MEMS devices arranged along an RF electrode according to one embodiment.

FIG. 16 is a top view of multiple MEMS capacitors arranged along an RF electrode, labeled "RF" which can be included inside a single cavity. Two control electrodes, labeled "CNT" are also present. The individual MEMS capacitors utilize a common RF electrode and common control electrodes. The support arms are coupled to ground, which is labeled "GND". The RF-GND arrangement implements a coplanar structure which confines electromagnetic fields inside the cavity minimizing stray effects. As shown in FIG. 16, there is a plurality of cantilevers that are each adjacent to the common RF line. Additionally, there are two control electrodes, which may be referred to as first and second electrodes. The plurality of cantilevers pivot or move between a position spaced a first distance from the RF line and a position spaced a second distance from the RF line. The distance that the grounded cantilevers are spaced from the RF line determines the capacitance.

As shown in FIG. 16, there is a first electrode, a second electrode and a RF line that is common for the entire structure. The plurality of cantilevers share the common first, second and RF electrodes. Additionally, the cantilevers and electrodes collectively function as a digital variable capacitor and may be contained within a single cavity within a device structure. For example, the digital variable capacitor may be embedded within a cavity within a CMOS device such that an electrical connection is made from below the digital variable capacitor to a location above the cavity and the digital variable capacitor.

Figure 17A:
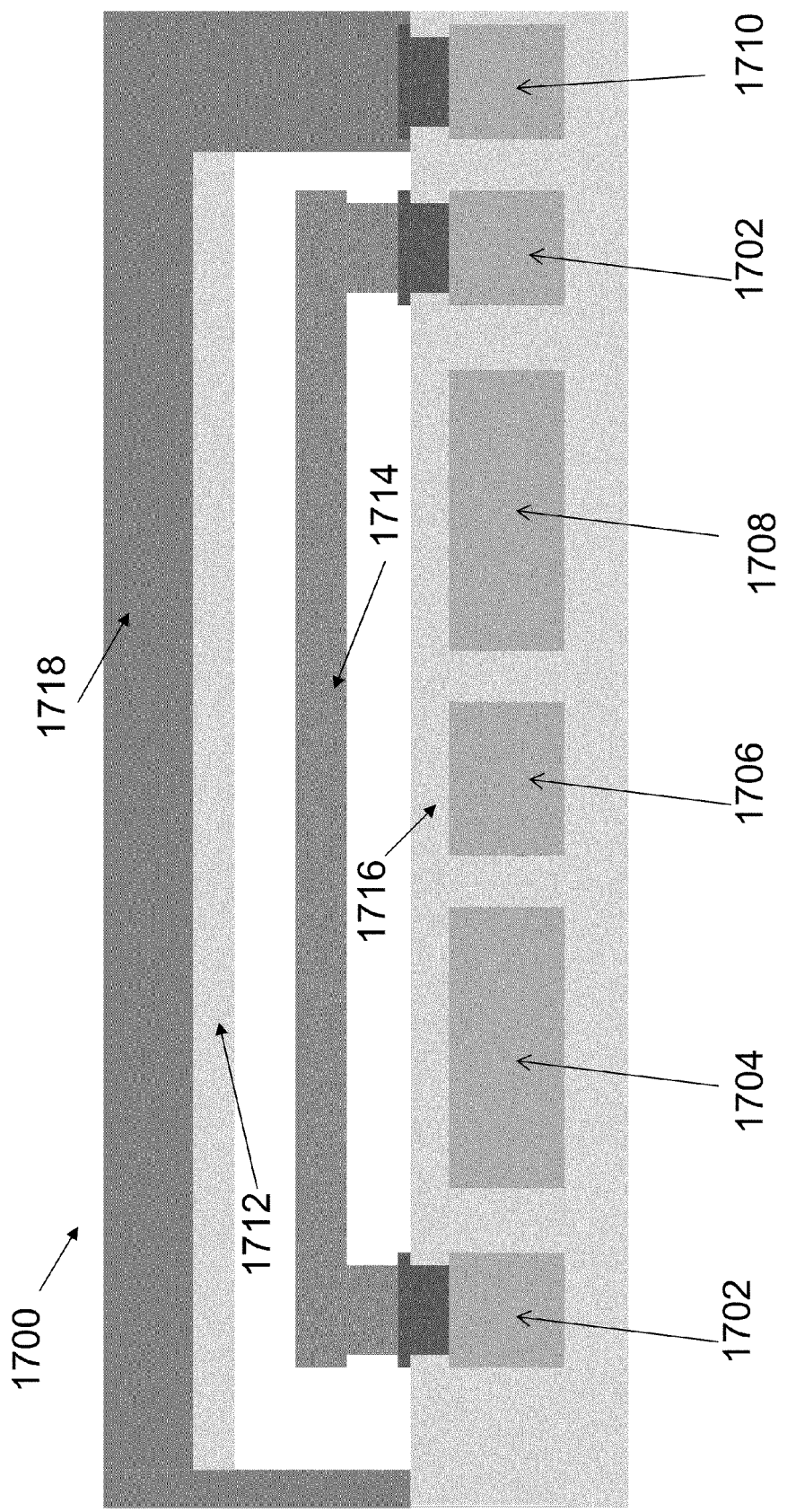
FIGS. 17A-17C are schematic cross sectional views of a MEMS capacitor switch in the free standing state, the down state and the up state according to one embodiment.
Figure 17B:
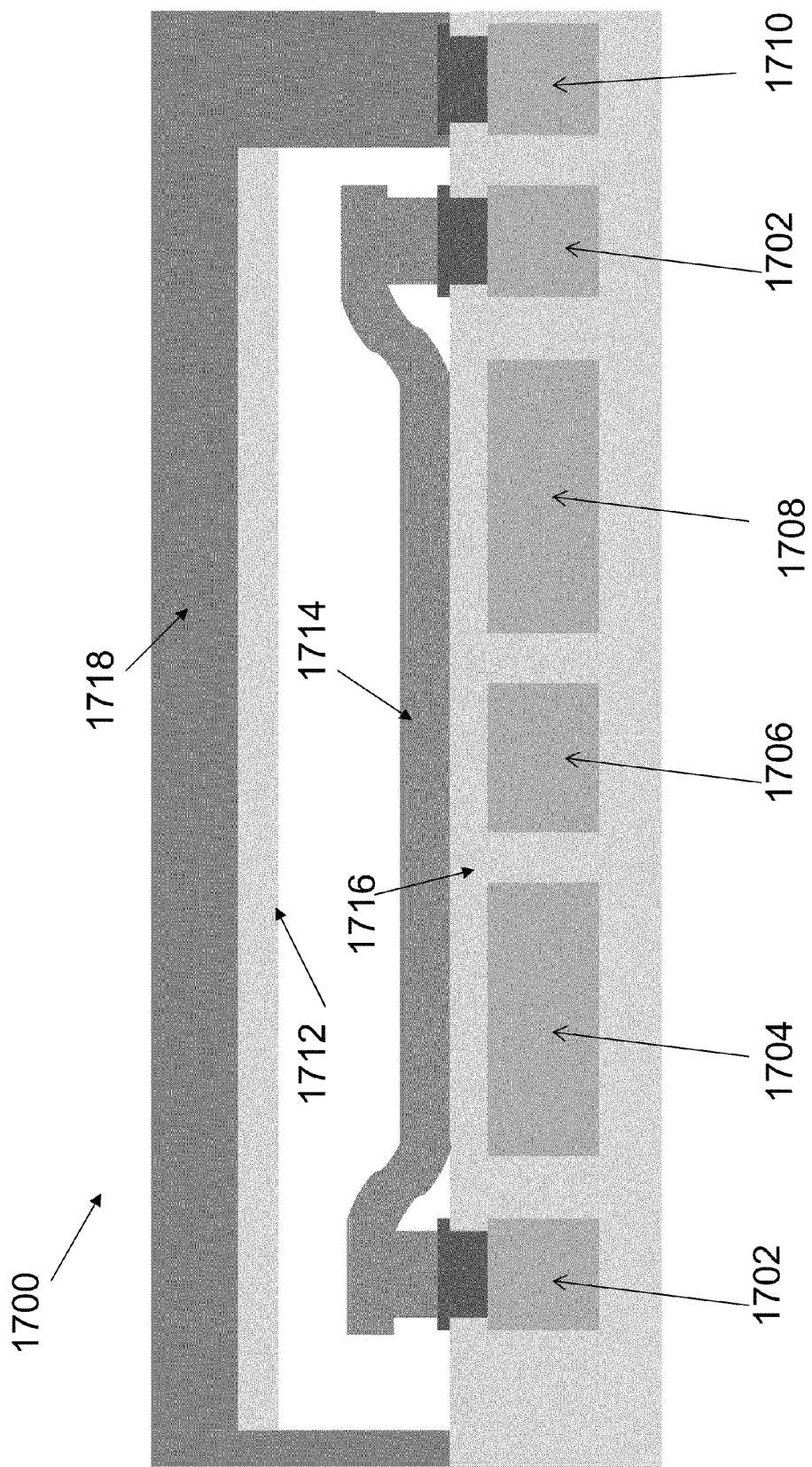
Figure 17C:
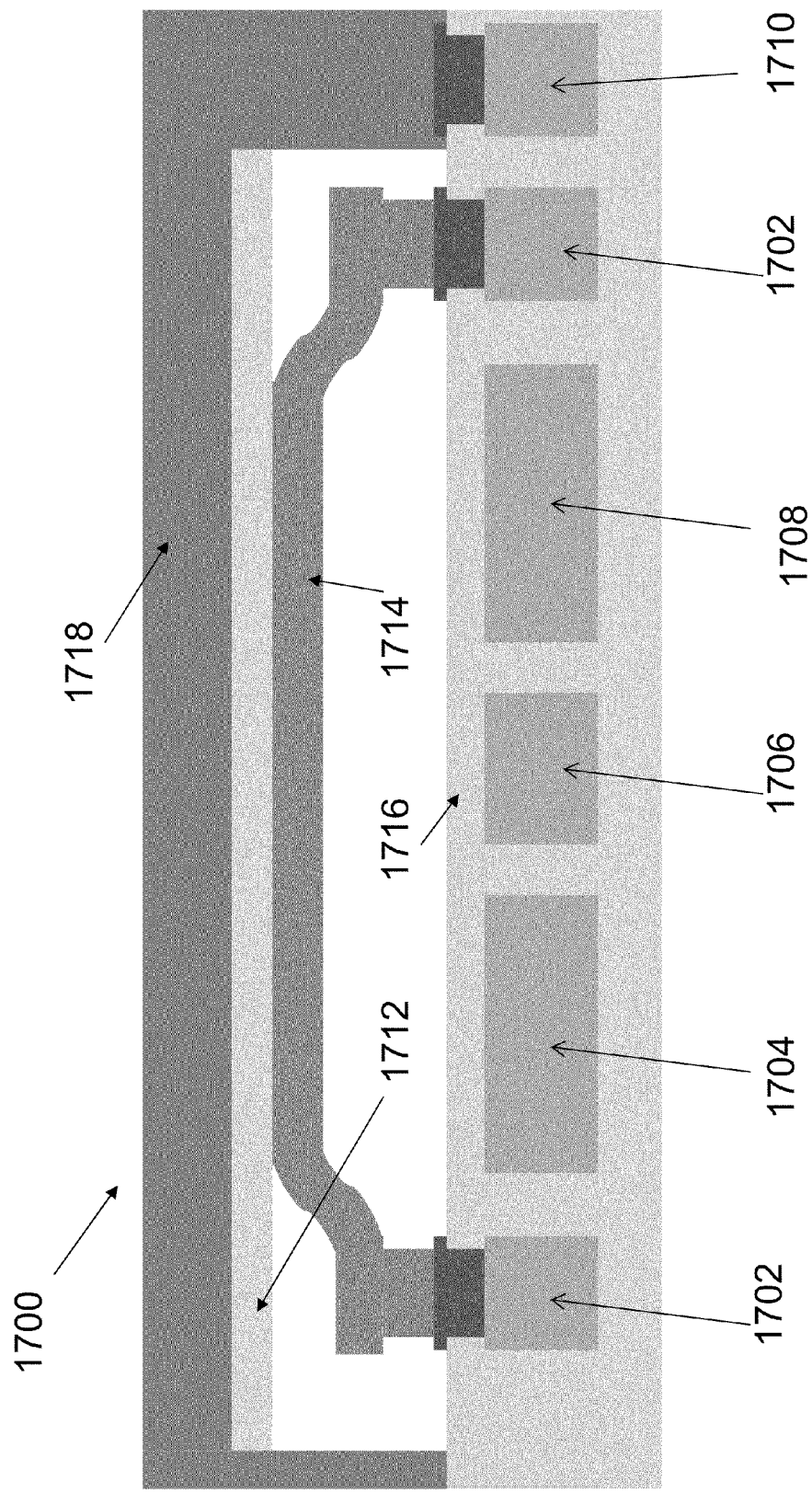

FIGS. 17A-17C are schematic cross sectional views of a MEMS capacitor switch 1700 in the free standing position, the down state and the up state according to one embodiment. In FIGS. 17A-17C, the switch 1700 has multiple ground electrodes 1702, a first pull-down electrode 1704, an RF electrode 1706, a second pull-down electrode 1708, an insulating layer 1716 formed over the pull-down electrodes 1704, 1708 and the RF electrode 1706, a pull-up electrode connection 1710, an insulating layer 1712 disposed over the pull-up electrode 1718, and a cantilever 1714. In one embodiment, the insulating layers 1712, 1716 may comprise an oxide. In FIG. 17A, the cantilever is in the free standing position spaced from the oxide layer 1716 over the electrodes 1704, 1706, 1708 and spaced from the oxide layer 1712 formed over the pull-up electrode 1718.

In FIG. 17B, the cantilever 1714 is in the down state where the cantilever 1714 is in contact with the insulating layer 1716 that overlies the electrodes 1704, 1706 and 1708. The cantilever 1714 is spaced a small distance from the RF electrode 1706 by the insulating layer 1716 and thus, a large capacitance is present because the cantilever 1714 is grounded and the RF electrode 1706 is RF hot. When the cantilever 1714 is in the up state and in contact with the insulating layer 1712 formed over the pull-up electrode 1718, a large distance is present between the RF electrode 1706 and the cantilever 1714 which is grounded. Thus, there is a small capacitance in FIG. 17C relative to FIG. 17B. The switch 1700 becomes a digital variable capacitor with each smaller capacitor having two states. The first state is where the cantilever 1714 is pulled down touching the thin insulating layer 1716 over the RF electrode 1706. The second state is where the cantilever 1714 is pulled up in contact with the oxide layer that overlies the pull-up electrode 1718. The capacitance is given by:

$$C = A \in \in_o / d$$

where A is the area of overlap between the RF line and the cantilever, $\in$ is the dielectric constant, $\in_o$ is the relative dielectric constant of the material between the RF line and the cantilever and d is the distance between the cantilever and the RF line. In one embodiment, d is between about 0.2 microns and about 1.0 microns. In another embodiment, d is between about 100 nm to about 1 micron. In one embodiment, the cavity in which the device is disposed may have at least one dimension (i.e., length, width or height) that is between about 20 microns to about 30 microns. In another embodiment, the cavity may have at least one dimension that is up to about 300 microns. In one embodiment, the cavity may have at least one dimension that is between about 140 microns and about 155 microns. In cavities that have at least one dimension that is greater than about 30 microns, support posts may be present in the cavity to support the roof of the cavity. In some embodiments, support posts may not be present.

In order to function as a capacitor, the pull down electrodes 1704, 1708 may provide a first voltage. In one embodiment, the pull down electrodes 1704, 1708 provide the same voltage. Simultaneously, the pull-up electrode 1718 may provide a second voltage in opposition to the first voltage. Thus, the cantilever 1714 may be pulled down into contact with the insulating layer 1716 because the cantilever 1714 is pulled in by the pull down electrodes 1704, 1708 and repelled by the pull-up electrode 1718. Similarly, the voltages may be reversed to move the cantilever 1714 to the position in contact with the insulating layer 1712.

When operating as a digital variable capacitor, such as shown in FIG. 16, a plurality of cantilevers are coupled to ground and disposed above an RF electrode and one or more pull-down electrodes. One or more pull-up electrodes are also present. The cantilevers move between two states. The first state has the cantilever spaced a small distance from the RF electrode. The second state has the cantilever spaced a greater distance from the RF electrode. The grounded cantilever is never in direct contact with the RF electrode. It is the spacing between the RF electrode and the grounded capacitor that creates a capacitance.

The advantage of having a large number of smaller capacitors rather than a few larger ones is that the capacitors can be made with smaller dimensions so that they can be housed in a cavity in the back end metallization layers of a normal CMOS process. If they are made too large the cavity then becomes too large and the residual stresses in the cavity roof makes them buckle up or down. This problem could be solved with layers thicker than one micron, but then it becomes increasingly difficult to process the cavity in a standard back end process. This then increases costs.

While the foregoing is directed to embodiments of the present invention, other and further embodiments of the invention may be devised without departing from the basic scope thereof, and the scope thereof is determined by the claims that follow.

The invention claimed is:

1. A device structure, comprising:
   a substrate;
   a plurality of layers formed over the substrate, a first layer of the plurality of layers bounding one or more cavities formed within the structure between the substrate and the plurality of layers;
   a plurality of micro electromechanical devices disposed over the substrate and within each of the one or more cavities;
   a pull up electrode within at least one of the one or more cavities and coupled with the first layer above the plurality of micro electromechanical devices; and
   a via connection from the substrate to one or more layers disposed over the one or more cavities;
   wherein the one or more cavities and plurality of micro electromechanical devices are embedded within a complementary metal oxide semiconductor; and
   wherein a first device of the plurality of devices has a different design than a second device of the plurality of devices.

2. The device structure of claim 1, wherein at least one of the one or more cavities has a length, a width and a height where at least one of the length or width is between about 20 microns and about 30 microns.

3. A device structure, comprising:
   a substrate;
   a plurality of layers formed over the substrate, a first layer of the plurality of layers bounding one or more cavities formed within the structure between the substrate and the plurality of layers;
   a plurality of micro electromechanical devices disposed over the substrate and within each of the one or more cavities;
   a pull up electrode within at least one of the one or more cavities and coupled with the first layer above the plurality of micro electromechanical devices;
   a via connection from the substrate to one or more layers disposed over the one or more cavities;
   a first electrode;
   a second electrode; and
   a plurality of cantilevers that are each movable from a position in contact with the first electrode to a position spaced from both the first electrode and the second electrode to a position in contact with the second electrode.

4. The device structure of claim 3, wherein the device structure is a digital variable capacitor.

5. The device structure of claim 4, further comprising a third electrode, wherein each of the plurality of cantilevers is coupled to the third electrode.

6. A device structure, comprising:
   a substrate;
   a layer formed over the substrate and bounding a cavity formed within the structure;
   a plurality of micro electromechanical devices disposed within the cavity;
   a pull up electrode within the cavity and coupled with the layer;
   a via connection from the substrate to layer;
   a first electrode;
   a second electrode; and
   a plurality of cantilevers that are each movable from a position in contact with the first electrode to a position spaced from both the first electrode and the second electrode to a position in contact with the second electrode, wherein:
   the cavity has a length, a width and a height where at least one of the length or width is between about 20 microns and about 30 microns;
   the cavity and plurality of micro electromechanical devices are embedded within a complementary metal oxide semiconductor; and
   a first device of the plurality of devices has a different design than a second device of the plurality of devices.

7. The device structure of claim 6, wherein the device structure is a digital variable capacitor.

8. The device structure of claim 7, further comprising a third electrode, wherein each of the plurality of cantilevers is coupled to the third electrode.

9. A device structure, comprising:
a substrate;
a layer formed over the substrate and bounding a cavity formed within the structure;
a plurality of micro electromechanical devices disposed within the cavity;
a pull up electrode within the cavity and coupled with the layer;
a via connection from the substrate to layer;
a first electrode;
a second electrode; and
a plurality of cantilevers that are each movable from a position in contact with the first electrode to a position spaced from both the first electrode and the second electrode to a position in contact with the second electrode.

10. The device structure of claim 9, wherein the device structure is a digital variable capacitor.

11. The device structure of claim 9, further comprising a third electrode, wherein each of the plurality of cantilevers is coupled to the third electrode.

12. The device structure of claim 10, further comprising a third electrode, wherein each of the plurality of cantilevers is coupled to the third electrode.

* * * * *

UNITED STATES PATENT AND TRADEMARK OFFICE
CERTIFICATE OF CORRECTION

| | | |
|---|---|---|
| PATENT NO. | : 8,861,218 B2 | Page 1 of 1 |
| APPLICATION NO. | : 12/614929 | |
| DATED | : October 14, 2014 | |
| INVENTOR(S) | : Smith et al. | |

It is certified that error appears in the above-identified patent and that said Letters Patent is hereby corrected as shown below:

In the Specification

In Detailed Description:

Column 6, Line 11, please delete "Fig. 10" and insert --Fig. 1D-- therefor.

Signed and Sealed this
Twenty-first Day of April, 2015

Michelle K. Lee
*Director of the United States Patent and Trademark Office*